United States Patent
Ishii et al.

(10) Patent No.: US 12,128,451 B2
(45) Date of Patent: Oct. 29, 2024

(54) SUBSTRATE PROCESSING SYSTEM AND SUBSTRATE PROCESSING METHOD

(71) Applicant: SCREEN Holdings Co., Ltd., Kyoto (JP)

(72) Inventors: Hiroaki Ishii, Kyoto (JP); Junichi Ishii, Kyoto (JP); Kazuhiro Honsho, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 339 days.

(21) Appl. No.: 17/553,869

(22) Filed: Dec. 17, 2021

(65) Prior Publication Data

US 2022/0203409 A1 Jun. 30, 2022

(30) Foreign Application Priority Data

Dec. 28, 2020 (JP) ................................. 2020-219355

(51) Int. Cl.
*B05D 3/00* (2006.01)
*B08B 3/02* (2006.01)
*B08B 13/00* (2006.01)

(52) U.S. Cl.
CPC .............. *B08B 3/022* (2013.01); *B08B 13/00* (2013.01)

(58) Field of Classification Search
CPC .......... B05D 3/00; B05D 3/007; B08B 3/022; B08B 13/00
See application file for complete search history.

(56) References Cited

U.S. PATENT DOCUMENTS

| 7,985,699 B2 * | 7/2011 | Nishimura | .......... H01L 21/3065 257/E21.492 |
| 2008/0176002 A1 | 7/2008 | Tsutsumi et al. | ............. 427/496 |

(Continued)

FOREIGN PATENT DOCUMENTS

| JP | 2005-260032 A | 9/2005 |
| JP | 2007214365 A * | 8/2007 |

(Continued)

OTHER PUBLICATIONS

JP-2007214365-A English translation (Year: 2007).*

*Primary Examiner* — Hai Y Zhang
(74) *Attorney, Agent, or Firm* — OSTROLENK FABER LLP

(57) ABSTRACT

The substrate processing system is provided with a first substrate holding unit which includes a first base that faces from below a substrate having a protected target surface and a cleaning target surface on the opposite side of the protected target surface and holds the substrate in a first posture in which the protected target surface is facing upward, a protective film coating nozzle which coats a protective film at least at a peripheral edge portion of the protected target surface of the substrate that is held by the first substrate holding unit, a first turning unit which turns around the substrate while in contact with a peripheral edge portion of the substrate so that the posture of the substrate can be changed from the first posture to a second posture in which the protected target surface is facing downward, a second substrate holding unit which includes a second base that faces the substrate from below and holds the substrate in the second posture, and a cleaning unit which cleans the cleaning target surface of the substrate that is held by the second substrate holding unit.

10 Claims, 21 Drawing Sheets

(56) References Cited

U.S. PATENT DOCUMENTS

| | | | |
|---|---|---|---|
| 2014/0144464 A1* | 5/2014 | Kaneko | H01L 21/0209 134/4 |
| 2019/0067077 A1 | 2/2019 | Muramoto | |
| 2019/0366394 A1 | 12/2019 | Yoshida et al. | |

FOREIGN PATENT DOCUMENTS

| | | |
|---|---|---|
| JP | 2008-177471 A | 7/2008 |
| JP | 2012-190967 A | 10/2012 |
| JP | 2014-107313 A | 6/2014 |
| JP | 2018-056466 A | 4/2018 |
| KR | 10-0903725 B1 | 6/2009 |
| TW | 201921577 A | 6/2019 |
| TW | 202030147 A | 8/2020 |
| TW | 202042331 A | 11/2020 |
| WO | WO 2020/166282 A1 | 8/2020 |
| WO | WO 2020/195722 A1 | 10/2020 |

\* cited by examiner

SUBSTRATE PROCESSING SYSTEM AND SUBSTRATE PROCESSING METHOD

CROSS REFERENCE TO RELATED APPLICATIONS

This application corresponds to Japanese Patent Application No. 2020-219355 filed with the Japan Patent Office on Dec. 28, 2020, and the entire disclosure of this application is incorporated herein by reference.

BACKGROUND OF THE INVENTION

1. Field of the Invention

The present invention relates to a substrate processing system which processes a substrate and a substrate processing method which processes a substrate. Examples of substrates to be processed include semiconductor wafers, substrates for FPDs (Flat Panel Display) such as liquid crystal display devices and organic EL (Electroluminescence) display devices, etc., substrates for optical disks, substrates for magnetic disks, substrates for magneto-optical disks, substrates for photomasks, ceramic substrates, substrates for solar cells, etc.

2. Description of the Related Art

In Japanese Patent Application Publication No. 2018-56466, disclosed is a substrate processing apparatus in which a device surface which is an upper surface of a substrate is processed with IPA (isopropyl alcohol) and, thereafter, a non-device surface which is a lower surface of the substrate is cleaned.

SUMMARY OF THE INVENTION

In Japanese Patent Application Publication No. 2018-56466, the non-device surface is cleaned in a state that the non-device surface is facing downward. Since members such as a spin base are disposed below the non-device surface, the means for cleaning the non-device surface is spatially limited.

In order to relax the space limitation, it can be considered to clean the non-device surface in a state that the non-device surface is facing upward. For this purpose, the substrate needs to be turned around before the substrate is transferred to a substrate processing apparatus. However, in this case, a problem arises that a member used for turning around the substrate is brought into contact with the device surface to contaminate the device surface.

Thus, an object of the present invention is to provide a substrate processing system and a substrate processing method capable of satisfactorily cleaning a cleaning target surface of a substrate, while preventing contamination of a protected target surface of the substrate.

One mode of the present disclosure is to provide a substrate processing system including a first substrate holding unit which includes a first base that faces from below a substrate having a protected target surface and a cleaning target surface on the opposite side of the protected target surface and which holds the substrate in a first posture in which the protected target surface is facing upward, a protective film coating nozzle which coats a protective film at least at a peripheral edge portion of the protected target surface of the substrate that is held by the first substrate holding unit, a first turning unit which turns around the substrate while in contact with a peripheral edge portion of the substrate so that the posture of the substrate can be changed from the first posture to a second posture in which the protected target surface is facing downward, a second substrate holding unit which includes a second base that faces the substrate from below and holds the substrate in the second posture, and a cleaning unit which cleans the cleaning target surface of the substrate that is held by the second substrate holding unit.

According to this configuration, when the substrate is turned around, the peripheral edge portion of the substrate is brought into contact with the first turning unit. Therefore, the substrate is turned around in a state that the protective film is coated at least at the peripheral edge portion of the protected target surface, which makes it possible to change the posture of the substrate to the second posture, while preventing contamination resulting from contact with the first turning unit. Thereafter, in a state that the substrate is in the second posture, the cleaning target surface of the substrate can be cleaned from above by the cleaning unit. Therefore, the cleaning target surface can be satisfactorily cleaned without the space limitation by the second base.

As described above, it is possible to satisfactorily clean the cleaning target surface of the substrate, while preventing contamination of the protected target surface of the substrate. It is noted that the contamination means adhesion of contamination substances, for example, particles, etc.

In one mode of the present disclosure, the first substrate holding unit includes a first suctioning/holding unit in which a central portion of the cleaning target surface is suctioned by the first base to hold the substrate. Therefore, the first substrate holding unit can hold the substrate without providing a member that is brought into contact with the peripheral edge portion of the substrate. That is, the protective film can be coated without providing a member that prevents coating of the protective film in the vicinity of the peripheral edge portion of the protected target surface of the substrate. It is therefore possible to enhance uniformity of the protective film with respect to the peripheral edge portion of the protected target surface. Thus, it is possible to further prevent contamination of the protected target surface of the substrate.

In one mode of the present disclosure, the second substrate holding unit includes a plurality of chuck pins which are supported by the second base to grip the substrate in contact with the peripheral edge portion of the protected target surface of the substrate.

When cleaning the cleaning target surface, it is necessary that the second base is caused to suction at the central portion of the protected target surface of the substrate or the peripheral edge portion of the substrate is gripped by the plurality of chuck pins supported by the second base. That is, the cleaning target surface is cleaned in a state that a member which constitutes the second substrate holding unit is brought into contact with at least a part of the protected target surface of the substrate.

According to this substrate processing system, the protective film is coated at least at the peripheral edge portion of the protected target surface of the substrate. Therefore, the peripheral edge portion of the substrate can be gripped by the plurality of chuck pins without the plurality of chuck pins being directly brought into contact with the peripheral edge portion of the protected target surface of the substrate. It is therefore possible to prevent with a high degree of reliability contamination of the protected target surface resulting from the substrate that is held at the time of cleaning.

In one mode of the present disclosure, the protective film coating unit is configured so as to coat the protective film on the entirety of the protected target surface of the substrate. Moreover, the second substrate holding unit includes a second suctioning/holding unit in which the central portion of the protected target surface is suctioned by the second base to hold the substrate.

According to this configuration, the protective film is coated on the entirety of the protected target surface of the substrate. Therefore, without the second base being directly brought into contact with the central portion of the protected target surface of the substrate, the central portion of the protective film can be suctioned by the second base to hold the substrate. Therefore, it is possible to prevent contamination of the protected target surface resulting from the substrate that is held at the time of cleaning.

In one mode of the present disclosure, the cleaning unit includes a spray nozzle which sprays droplets of a cleaning liquid toward the cleaning target surface, thereby executing spray cleaning on the cleaning target surface.

According to this configuration, droplets of the cleaning liquid are sprayed toward the cleaning target surface from the spray nozzle to execute the spray cleaning. Therefore, the cleaning target surface is effectively cleaned by a physical force resulting from collision of droplets of the cleaning liquid.

In one mode of the present disclosure, the cleaning unit includes a cleaning member which is brought into contact with the cleaning target surface of the substrate to scrub-clean the cleaning target surface.

According to this configuration, the cleaning member is brought into contact with the cleaning target surface to execute scrub cleaning. Therefore, contamination substances scattered from the cleaning target surface resulting from the scrub cleaning float in an atmosphere. If the protected target surface has been protected by coating of the protective film, it is possible to prevent adhesion of the contamination substances to the protected target surface.

In one mode of the present disclosure, the substrate processing system further includes a second turning unit which turns around the substrate while in contact with the peripheral edge portion of the substrate so that the posture of the substrate can be changed from the second posture to the first posture, a third substrate holding unit which includes a third base that faces the substrate from below and holds the substrate in the first posture and a removing liquid nozzle which supplies a removing liquid that removes the protective film from the protected target surface to the protected target surface of the substrate that is held by the third substrate holding unit.

According to this configuration, the removing liquid can be supplied from above toward the protected target surface of the substrate. Therefore, as compared with a configuration that the removing liquid is supplied to the protected target surface that is facing downward, the removing liquid can be easily spread across the entirety of the protected target surface. Consequently, the protective film can be satisfactorily removed from the protected target surface.

In one mode of the present disclosure, the first substrate holding unit also serves as the third substrate holding unit. Therefore, the protective film is coated and removed in a state of being held by the same substrate holding unit (first substrate holding unit). Consequently, as compared with a case that another substrate holding unit is provided for removing the protective film, the substrate processing system can be made smaller.

In one mode of the present disclosure, the substrate processing system further includes a second turning unit which turns around the substrate while in contact with the peripheral edge portion of the substrate so that the posture of the substrate can be changed from the second posture to the first posture, a third substrate holding unit which includes a third base that faces the substrate from below and holds the substrate in the first posture, and a drying/removing unit which executes plasma processing or light irradiation processing on the protected target surface of the substrate that is held by the third substrate holding unit, thereby removing the protective film from the protected target surface.

According to this configuration, plasma processing or ultraviolet ray irradiation processing is executed, by which the protective film can be removed from the protected target surface, with no liquid supplied to the substrate. Therefore, it is possible to save time and labor for drying the substrate and prevent occurrence of watermarks (dry marks) when drying the protected target surface.

In one mode of the present disclosure, the substrate processing system further includes a gas supplying unit which supplies a gas to a space between the protected target surface of the substrate that is held by the second substrate holding unit and the second base. According to this configuration, since the gas is supplied to the space between the second base and the protected target surface, an air flow which moves from the space to an exterior of the space is formed. It is therefore possible to prevent contamination substances scattered into an atmosphere during cleaning of the cleaning target surface from flowing into the space between the second base and the protected target surface and adhering to the protected target surface. Consequently, the protected target surface of the substrate can be satisfactorily protected.

In one mode of the present disclosure, the substrate processing system further includes a container placing member which places a container that houses the substrate in the first posture, and a transfer unit which has a hand in contact with a peripheral edge portion of the cleaning target surface or the protected target surface of the substrate that is facing downward and transfers the substrate between the container placing member, the first substrate holding unit, the first turning unit, and the second substrate holding unit.

According to this configuration, the substrate can be transferred by the transfer unit from the container placed in the container placing member to the first substrate holding unit. The substrate is housed in the container in the first posture. Therefore, the substrate carried out from the container can be held in the first posture by the first substrate holding unit without being turned around.

Further, the substrate can be transferred from the first substrate holding unit to the first turning unit by the transfer unit. After coating of the protective film on the protected target surface, the substrate that has been transferred to the first turning unit is turned around by the first turning unit, which makes it possible to change the posture of the substrate to the second posture, while preventing contamination of the protected target surface of the substrate resulting from contact of the first turning unit with the peripheral edge portion of the substrate. Thereafter, the substrate is transferred by the transfer unit from the first turning unit to the second substrate holding unit, by which the substrate is held in the second posture by the second substrate holding unit and the cleaning target surface can be cleaned.

Another mode of the present disclosure is to provide a substrate processing method including a first substrate holding step which holds a substrate that has a protected target surface and a cleaning target surface on the opposite side of the protected target surface in a first holding position to face a first base from above in a first posture in which the protected target surface is facing upward, a protective film coating step which coats a protective film at least at a peripheral edge portion of the protected target surface of the substrate that is held in the first posture in the first holding position by the first substrate holding step, a first turning step in which the first turning unit is brought into contact with a peripheral edge portion of the substrate to turn around the substrate so that, after the protective film coating step, the posture of the substrate can be changed from the first posture to a second posture in which the protected target surface is facing downward, a second substrate holding step which holds the substrate, the posture of which has become the second posture by the first turning step, in a second holding position to face the second base from above, and a cleaning step which executes cleaning on the cleaning target surface of the substrate that is held in the second posture in the second holding position by the second substrate holding step.

According to this method, the same effects as the above-described substrate processing system can be obtained.

In another mode of the present disclosure, the substrate processing method includes a second turning step in which a peripheral edge portion of the substrate is gripped by the second turning unit to turn around the substrate so that, after the cleaning step, the posture of the substrate can be changed from the second posture to the first posture, a third substrate holding step which holds the substrate, the posture of which has become the first posture by the second turning step, in the third holding position to face a third base from above, and a protective film removing step which removes the protective film by supplying a removing liquid to the substrate that is held in the first posture in the first holding position by the third substrate holding step.

In another mode of the present disclosure, the substrate processing method includes a second turning step in which the second turning unit is brought into contact with a peripheral edge portion of the substrate to turn around the substrate so that, after the cleaning step, the posture of the substrate can be changed from the second posture to the first posture, a third substrate holding step which holds the substrate in the first posture in the third holding position to face the third base from above, and a protective film removing step in which plasma processing or light irradiation processing is executed on the substrate that is held in the first posture in the third holding position by the third substrate holding step, thereby removing the protective film from the protected target surface.

The aforementioned as well as yet other objects, features, and effects of the present invention will be made clear by the following description of the preferred embodiments, with reference to the accompanying drawings.

DETAILED DESCRIPTION OF THE PREFERRED EMBODIMENTS

First Preferred Embodiment

Figure 1A:
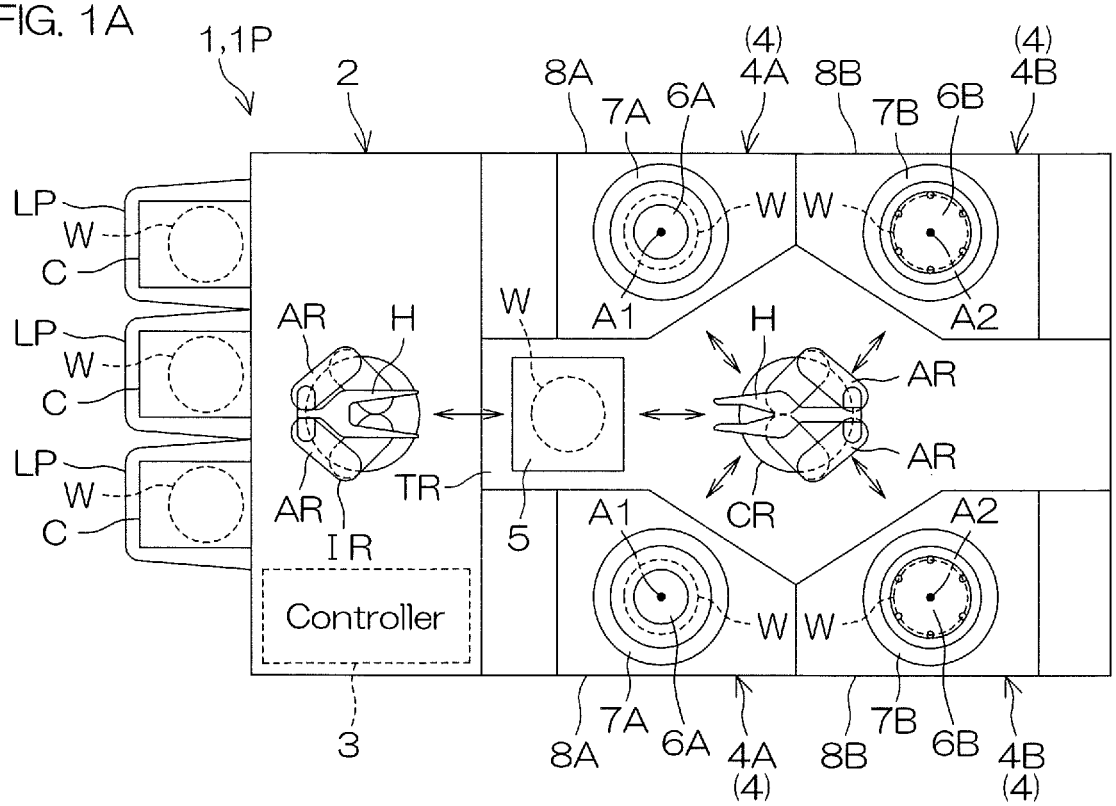
FIG. 1A is a plan view for describing a configuration of a substrate processing apparatus provided in a substrate processing system according to a first preferred embodiment of the present invention.
Figure 1B:
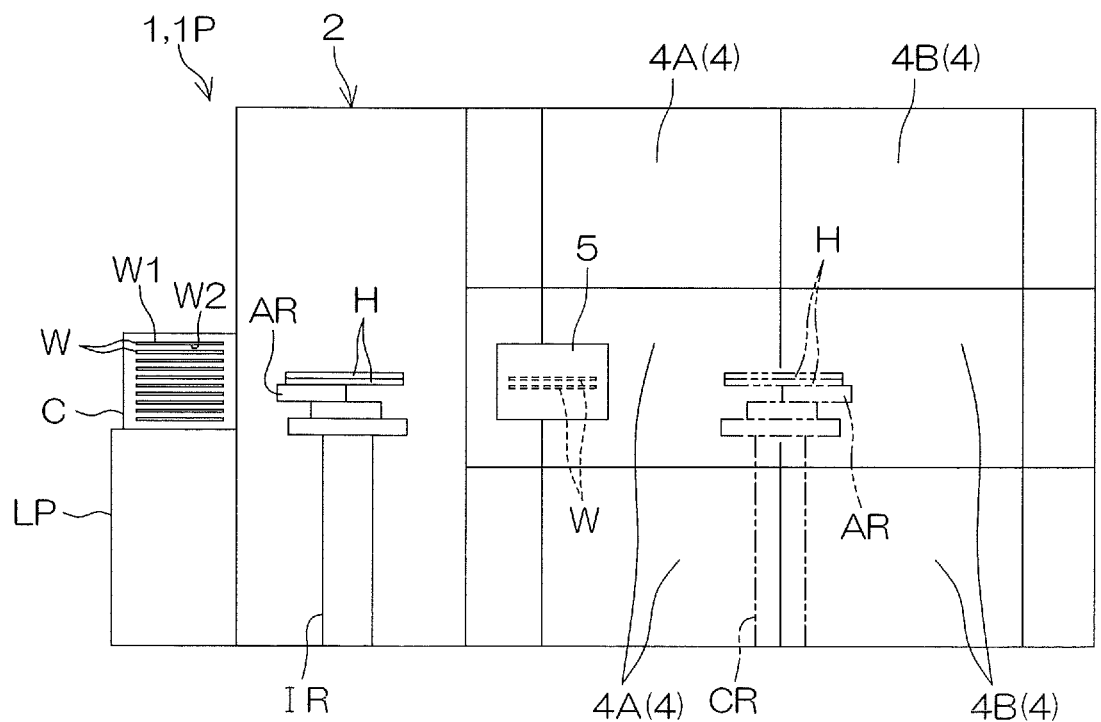
FIG. 1B is an illustrative elevation view for describing the configuration of the substrate processing apparatus.

FIG. 1A is a plan view for describing a configuration of a substrate processing apparatus 2 provided in a substrate processing system 1 according to the first preferred embodiment of the present invention. FIG. 1B is an illustrative elevation view for describing the configuration of the substrate processing apparatus 2.

The substrate processing system 1 is a system for processing a substrate W such as silicon wafer, etc. The substrate processing system 1 includes a single substrate processing apparatus (single substrate processing type apparatus) 2 which processes a substrate W one at a time and a controller 3 for controlling the substrate processing apparatus 2.

The substrate processing apparatus 2 includes a plurality of liquid processing devices 4 which process substrates W with liquids, a plurality of load ports (container placing members) LP on which respectively placed are a plurality of carriers (containers) C that house the plurality of substrates W processed by the liquid processing liquid processing devices 4, and a plurality of transfer robots (indexer robot IR and main transfer robot CR) which transfer the substrate W between the load port LP and the liquid processing device 4.

In this preferred embodiment, the substrate W is a disk-shaped substrate. The substrate W is, for example, 300 mm in diameter. The substrate W has a protected target surface W1 and a cleaning target surface W2 on the opposite side of the protected target surface W1. The protected target surface W1 is a surface to be protected, and the cleaning target surface W2 is a surface to be physically cleaned. The protected target surface W1 is either a device surface on which minute circuit patterns are formed or a non-device surface on which no circuit patterns are formed. The cleaning target surface W2 is also either the device surface or the non-device surface. The circuit pattern may be, for example, a line-like pattern formed by minute trenches or may be formed by providing a plurality of minute holes (voids or pores). Typically, the protected target surface W1 is a device surface, while the cleaning target surface W2 is a non-device surface.

Figure 2:
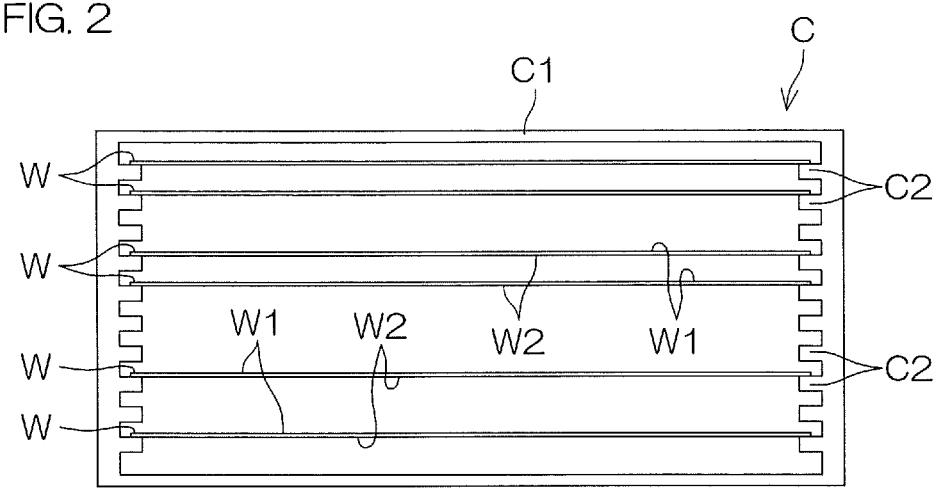
FIG. 2 is a schematic view for describing a configuration of a carrier placed on a load port provided in the substrate processing apparatus.

As shown in FIG. 2, each carrier C includes a cabinet portion C1 which houses the plurality of substrates W and a plurality of supporting portions C2 which make contact with a peripheral edge portion of the substrate W from below to support the substrate W one at a time. Therefore, the substrate W is housed in the carrier C in a first posture in which the protected target surface W1 is facing upward so that the protected target surface W1 will not be contaminated by contact with the supporting portion C2, and a peripheral edge portion of the cleaning target surface W2 of the substrate W is in contact with the supporting portion C2.

The peripheral edge portion of the cleaning target surface W2 is a region between a peripheral end of the substrate W and a position inside only by a predetermined distance from the peripheral end of the substrate W on the cleaning target surface W2. Similarly, a peripheral edge portion of the protected target surface W1 is a region between a peripheral end of the substrate W and a position inside only by a predetermined distance from the peripheral end of the substrate W on the protected target surface W1.

With reference to FIG. 1A and FIG. 1B, the plurality of transfer robots include an indexer robot IR which carries the substrate W in and carries it out from the carrier C on the load port LP and a main transfer robot CR which receives and delivers the substrate W from and to the indexer robot IR and carries the substrate W in and carries it out from the plurality of liquid processing devices 4.

The substrate processing apparatus 2 further includes a turning unit 5 which receives the substrate W from the indexer robot IR and the main transfer robot CR, grips the peripheral edge portion of the substrate W and turns around the substrate W. The substrate W is turned around by the turning unit 5, by which the posture of the substrate W is changed either to the first posture or a second posture in which the protected target surface W1 is facing downward.

The indexer robot IR and the main transfer robot CR are disposed on a transfer route TR extending from the load port LP to the plurality of liquid processing devices 4. The turning unit 5 is positioned between the indexer robot IR and the main transfer robot CR on the transfer route TR.

Each of the transfer robots is an articulated arm robot which includes a pair of articulated arms AR and a pair of hands H which are each provided at the leading ends of the pair of articulated arms AR so as to be separated up and down from each other. The hands H provided on each of the transfer robots are configured so as to be brought into contact with a peripheral edge portion of the cleaning target surface W2 or the protected target surface W1 which is facing downward, whereby holding the substrate W (refer to FIG. 8D and FIG. 8F which will be described later).

The plurality of liquid processing devices 4 constitute four processing towers disposed respectively in four positions which are separated horizontally. Each of the processing towers includes the plurality of liquid processing devices 4 (three in the example of FIG. 1B) which are stacked in an up/down direction. The four processing towers are disposed so that two of them are each on both sides of the transfer route TR.

The plurality of liquid processing devices 4 include a plurality of film coating/removing devices 4A which coat a protective film on the protected target surface W1 of the substrate W and remove the protective film from the protected target surface W1 and a plurality of physical cleaning devices 4B which execute physical cleaning on the cleaning target surface W2 of the substrate W. The physical cleaning is to clean the substrate W by applying a physical force to the substrate W. The physical force is an impact (kinetic energy) which is applied to the substrate W by a cleaning liquid or a cleaning member.

In this preferred embodiment, the two processing towers on the indexer robot IR side are constituted by the plurality of film coating/removing devices 4A, and the two processing towers on the opposite side of the indexer robot IR are constituted by the plurality of physical cleaning devices 4B.

Each of the film coating/removing devices 4A includes a first spin chuck 6A which rotates the substrate W around a vertical rotational axis A1 (vertical axis) passing through the center of the substrate W, while holding the substrate W horizontally, a first processing cup 7A which surrounds the first spin chuck 6A and receives a liquid scattered from the substrate W, and a first chamber 8A which houses the first spin chuck 6A and the first processing cup 7A.

Each of the physical cleaning devices 4B includes a second spin chuck 6B which rotates the substrate W around a vertical rotational axis A2 (vertical axis) passing through the center of the substrate W while holding the substrate W horizontally, a second processing cup 7B which surrounds the second spin chuck 6B and receives a liquid scattered from the substrate W, and a second chamber 8B which houses the second spin chuck 6B and the second processing cup 7B.

An inlet/outlet (not shown) for carrying in the substrate W and carrying out the substrate W by the main transfer robot CR is formed at the first chamber 8A. The first chamber 8A is provided with a shutter unit (not shown) for opening and closing the inlet/outlet. Like the first chamber 8A, the second chamber 8B has an inlet/outlet (not shown) and a shutter unit (not shown). The plurality of transfer robots constitute a transfer unit which transfers the substrate W between the plurality of carriers C (the plurality of load ports LP), the turning unit 5, the first spin chuck 6A and the second spin chuck 6B.

Figure 3:
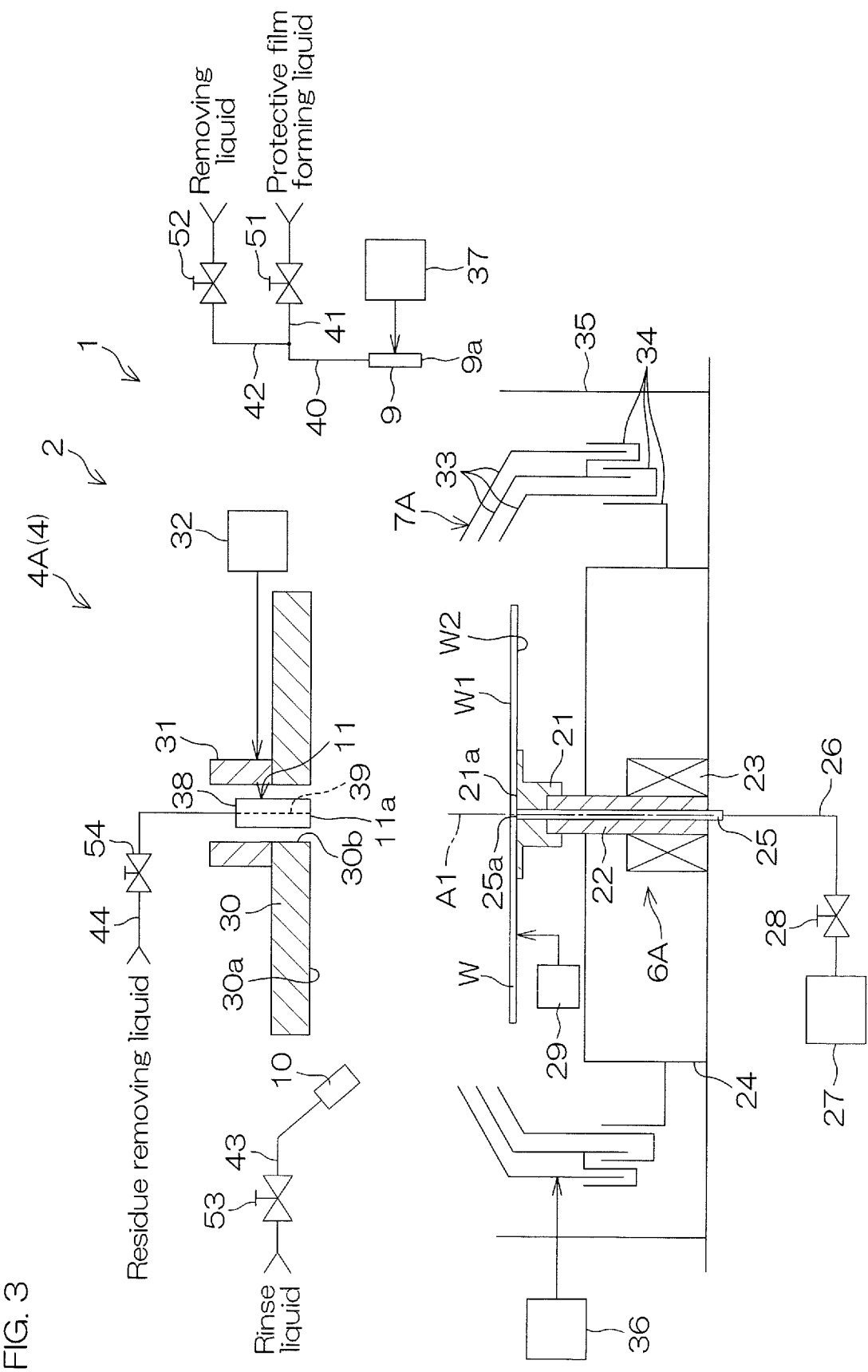
FIG. 3 is a schematic cross-sectional view for describing a configuration example of a film coating/removing device provided in the substrate processing apparatus.

FIG. 3 is a schematic cross-sectional view for describing a configuration example of the film coating/removing device 4A. In FIG. 3, the first chamber 8A is not shown.

The first spin chuck 6A is an example of a first substrate holding unit which holds the substrate W in the first posture. The first spin chuck 6A is also an example of a first substrate holding/rotating unit which rotates the substrate W around the rotational axis A1 while holding the substrate W in the first posture.

The first spin chuck 6A includes a first spin base 21 (first base) which faces the substrate W from below and holds by suction a central portion of the cleaning target surface W2 of the substrate W, a first rotating shaft 22 which extends along the rotational axis A1 in a vertical direction and is joined to the first spin base 21, a first spin motor 23 which rotates the first rotating shaft 22 around the rotational axis A1 and a first motor housing 24 which houses the first rotating shaft 22 and the first spin motor 23. The central portion of the cleaning target surface W2 is a region including a center of the cleaning target surface W2 and a region around the center, which is a region further to the center side than the peripheral edge portion of the cleaning target surface W2.

The first spin base 21 has a suction surface 21a which suctions the cleaning target surface W2 of the substrate W. The suction surface 21a is, for example, an upper surface of the first spin base 21 and is a circular surface in which the rotational axis A1 passes through the center thereof. A diameter of the suction surface 21a is smaller than that of the substrate W. An upper end portion of the first rotating shaft 22 protrudes from the first motor housing 24 and is joined to the first spin base 21.

A suction route 25 is inserted into the first spin base 21 and the first rotating shaft 22. The suction route 25 has a suction port 25a which is exposed from the center of the suction surface 21a of the first spin base 21. The suction route 25 is coupled to a suction piping 26. The suction piping 26 is coupled to a suction device 27 such as a vacuum pump, etc.

A suction valve 28 for opening and closing the route is interposed in the suction piping 26. The suction valve 28 is opened, by which the substrate W disposed on the suction surface 21a of the first spin base 21 is suctioned to the suction port 25a of the suction route 25. Thereby, the substrate W is suctioned to the suction surface 21a from below and held horizontally in a predetermined holding position (position of the substrate W shown in FIG. 3, first holding position). The first spin chuck 6A is an example of a first suctioning/holding unit which holds the substrate W horizontally, with the substrate W suctioned by the first spin base 21.

The first spin base 21 is rotated by the first rotating shaft 22 being rotated by the first spin motor 23. The substrate W is thereby rotated around the rotational axis A1 together with the first spin base 21.

The first spin chuck 6A may be provided with a centering unit 29 which moves the substrate W horizontally so that the center of the protected target surface W1 of the substrate W can come close to the rotational axis A1.

At a place higher than the first spin base 21, there is provided a blocking plate 30 which blocks an atmosphere inside a space between the space and the protected target surface W1 of the substrate W held by the first spin chuck 6A from an atmosphere outside the space.

The blocking plate 30 has a facing surface 30a which faces from above the protected target surface W1 of the substrate W held by the first spin chuck 6A. The blocking plate 30 is formed in a disk shape having substantially the same diameter or a diameter equal to or larger than that of the substrate W. A supporting shaft 31 is fixed to the blocking plate 30 on the opposite side of the facing surface 30a thereof.

The blocking plate 30 is connected to a blocking plate raising/lowering unit 32 which raises and lowers the blocking plate 30. The blocking plate raising/lowering unit 32 includes, for example, an actuator (not shown) such as an electric motor and an air cylinder that raises, lowers, and drives the supporting shaft 31. The blocking plate 30 may be rotatable around the rotational axis A1.

The first processing cup 7A includes a plurality of guards 33 which receive a liquid scattered from the substrate W held by the suction surface 21a of the first spin base 21, a plurality of cups 34 which receive a liquid guided downward by the plurality of guards 33, and an exhaust tank 35 which surrounds all the guards 33 and the cups 34 in a plan view.

FIG. 3 shows an example in which the three guards 33 and the three cups 34 are disposed. The cup 34 corresponds to each of the guards 33 on a one-to-one basis, and each cup 34 receives a liquid guided downward by the corresponding guard 33.

A first guard raising/lowering unit 36 which individually raises and lowers the plurality of guards 33 is connected to the plurality of guards 33. The first guard raising/lowering unit 36 individually raises and lowers the plurality of guards 33 between a lower position and an upper position. The first guard raising/lowering unit 36 includes a plurality of actuators (not shown) which drive individually the raising and lowering of the plurality of guards 33. The actuator may be an electric motor or an air cylinder.

The film coating/removing device 4A further includes a plurality of nozzles which supply a fluid from above toward the protected target surface W1 of the substrate W positioned in the first holding position. The plurality of nozzles include a moving nozzle 9 which moves in a horizontal direction and a vertical direction, a fixed nozzle 10 a horizontal position and a vertical position of which are fixed, and a central nozzle 11 which moves up and down together with the blocking plate 30 in a position facing a central portion of the protected target surface W1 of the substrate W that is positioned in the first holding position. The central portion of the protected target surface W1 is a region which includes the center of the protected target surface W1 and a region around the center, which is a region further to the center side than the peripheral edge portion of the protected target surface W1.

The moving nozzle 9 is connected to a plurality of nozzle moving units 37 which move in the horizontal direction and the vertical direction. The moving nozzle 9 can move between a center position and a home position (retreat position) in the horizontal direction. When positioned in the center position, the moving nozzle 9 faces the central portion of the protected target surface W1 of the substrate W. When positioned in the home position, the moving nozzle 9 does not face the protected target surface W1 of the substrate W but is positioned outside the first processing cup 7A in a plan view. The nozzle moving unit 37 includes an actuator (not shown) such as an electric motor or an air cylinder. The moving nozzle 9 may be a pivotal nozzle or may be a direct-driven type nozzle.

The moving nozzle 9 has a discharge port 9a at the tip thereof. The discharge port 9a is disposed higher than the first holding position. When the moving nozzle 9 faces the substrate W from above, the discharge port 9a faces the protected target surface W1 of the substrate W from above. The moving nozzle 9 is configured so that a protective film forming liquid and a removing liquid can be supplied (discharged) toward the protected target surface W1 of the substrate W that is positioned in the first holding position.

The moving nozzle 9 is an example of a protective film forming liquid nozzle which supplies the protective film forming liquid to the protected target surface W1 of the substrate Wand is also an example of a removing liquid nozzle which supplies the removing liquid such as ammonia water to the protected target surface W1 of the substrate W. The discharge port 9a is an example of a protective film forming liquid discharge port which discharges the protective film forming liquid and is also an example of a removing liquid discharge port which discharges the removing liquid.

The protective film forming liquid is a liquid which forms the protective film that protects the protected target surface W1 of the substrate W. A solute and a solvent are contained in the protective film forming liquid. The protective film forming liquid forms the protective film by volatilization (evaporation) of at least a part of the solvent contained in the protective film forming liquid. The protective film is a semi-solid state film or a solid state film which holds removal objects such as particles, etc., present on the substrate W and has a certain shape. The protective film may be in a gel state.

Although it is not clear when the protective film is formed, formation of the protective film can be estimated by an increase in viscosity of the protective film forming liquid to such an extent that a certain shape can be retained by evaporation of the solvent. When the protective film forming liquid is supplied to the substrate W in a rotating state, from the time the liquid is landed on the substrate W, evaporation of the solvent is started to form the protective film. Therefore, supply of the protective film forming liquid to the substrate W is also referred to as coating of the protective film. Consequently, the moving nozzle 9 is also an example of a protective film coating nozzle.

The protective film may be formed by solidification or hardening of the protective film forming liquid. Here, "solidification" means that a solute becomes solidified by a force, etc., acting between molecules and atoms, for example, in association with volatilization of a solvent. "Hardening" means that a solute hardens by chemical changes, for example, polymerization, cross linkage, etc. Consequently, "solidification or hardening" indicates that a solute "hardens" due to various factors.

The protective film forming liquid contains, as a solute, a low solubility component and a high solubility component higher in solubility to the removing liquid than the low solubility component. Substances different from each other in solubility to the removing liquid may be used as the low solubility component and the high solubility component. The low solubility component is, for example, novolak. The high solubility component is, for example, 2,2-bis(4-hydroxyphenyl)propane.

The solvent contained in the protective film forming liquid may be any liquid as long as it dissolves the low solubility component and the high solubility component. The solvent contained in the protective film forming liquid is preferably a liquid having a compatibility with the removing liquid. Compatibility is a property that two types of liquids are dissolved and mixed with each other.

The protective film forming liquid may contain a corrosion inhibiting component. Although the details will be described later, the corrosion inhibiting component is, for example, BTA (benzotriazole).

The protective film is mainly constituted of a low solubility component in a solid state (low solubility solids) and a high solubility component in a solid state (high solubility solids). The solvent may remain in the protective film. The details of individual components (solvent, low solubility component, high solubility component, and corrosion inhibiting component) contained in the protective film forming liquid will be described later.

The removing liquid is a liquid which peels the protective film and removes it from a principal surface of the substrate W. The removing liquid may be an alkaline aqueous solution (alkaline liquid) other than ammonia water. Specific examples of the alkaline aqueous solution other than ammonia water include a TMAH (tetramethyl ammonium hydroxide) aqueous solution, a choline aqueous solution and any combination of them. The removing liquid may be pure water (preferably DIW) or may be a neutral or acidic aqueous solution (non-alkaline aqueous solution).

A common piping 40 which guides the protective film forming liquid and the removing liquid into the moving nozzle 9 is connected to the moving nozzle 9. A protective film forming liquid piping 41 which guides the protective film forming liquid into the common piping 40 and a removing liquid piping 42 which guides the removing liquid into the common piping 40 are connected to the common piping 40.

When a protective film forming liquid valve 51 interposed in the protective film forming liquid piping 41 is opened, the protective film forming liquid is discharged downward in a continuous flow from the discharge port 9a of the moving nozzle 9. When a removing liquid valve 52 interposed in the removing liquid piping 42 is opened, the removing liquid is discharged downward in a continuous flow from the discharge port 9a of the moving nozzle 9.

The fixed nozzle 10 is disposed further outside than the blocking plate 30 in a plan view. A rinse liquid piping 43 which guides a rinse liquid into the fixed nozzle 10 is connected to the fixed nozzle 10. When a rinse liquid valve 53 interposed in the rinse liquid piping 43 is opened, the rinse liquid is discharged diagonally downward in a continuous flow from the fixed nozzle 10 and supplied to the central portion of the protected target surface W1 of the substrate W positioned in the first holding position. The fixed nozzle 10 is an example of a rinse liquid nozzle.

The rinse liquid is not limited to carbonated water. The rinse liquid may be a liquid which includes at least one of DIW (Deionized Water), carbonated water, electrolyzed ion water, an aqueous hydrochloric acid solution of dilute concentration (of, for example, not less than 1 ppm and not more than 100 ppm), ammonia water of dilute concentration (of, for example, not less than 1 ppm and not more than 100 ppm), and reduced water (hydrogen water).

A central nozzle 11 is housed in the blocking plate 30 and the supporting shaft 31. The discharge port 11a which is disposed at the tip of the central nozzle 11 is exposed from a through hole 30b formed in the blocking plate 30 and faces from above the central portion of the protected target surface W1 of the substrate W.

The central nozzle 11 includes a residue removing liquid tube 39 which supplies a residue removing liquid such as IPA to an upper surface of the substrate W and a tubular casing 38 which surrounds a plurality of tubes. The residue removing liquid tube 39 and the casing 38 extend along the rotational axis A1 in an up/down direction. The residue removing liquid is a liquid for dissolving residues of the protective film remaining on the protected target surface W1 of the substrate W and removing them from the substrate W after the protective film has been peeled by the removing liquid and eliminated from the upper surface of the substrate W. In addition to the residue removing liquid tube 39, a rinse liquid tube, a gas tube, etc., may be inserted into the casing 38.

The residue removing liquid tube 39 is connected to a residue removing liquid piping 44 which guides the residue removing liquid into the residue removing liquid tube 39. When a residue removing liquid valve 54 interposed in the residue removing liquid piping 44 is opened, the residue removing liquid is discharged in a continuous flow from the residue removing liquid tube 39 (central nozzle 11) toward the central portion of the protected target surface W1 of the substrate W. The residue removing liquid tube 39 may be constituted of a leading end portion of the residue removing liquid piping 44. The central nozzle 11 is an example of a residue removing liquid nozzle.

The residue removing liquid preferably has compatibility with the rinse liquid and the protective film forming liquid. The residue removing liquid dissolves residues of the protective film. The residue removing liquid is therefore also referred to as a residue dissolving liquid. The residue removing liquid is, for example, an organic solvent and may be a liquid which contains at least one of IPA, HFE (hydrofluoroether), methanol, ethanol, acetone, PGEE (propylene glycol monoethyl ether) and trans-1,2-dichloroethylene.

Figure 4:
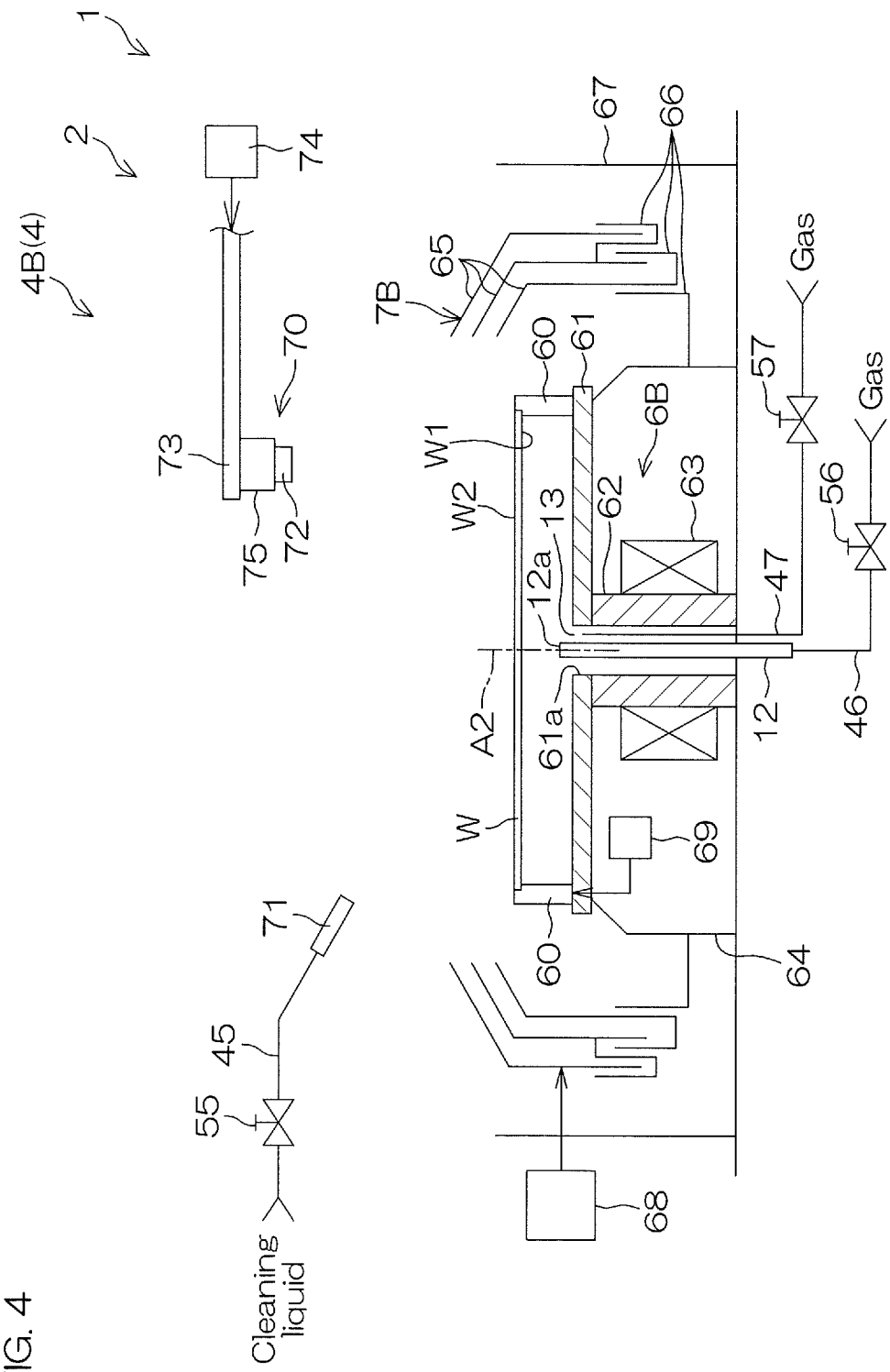
FIG. 4 is a schematic cross-sectional view for describing a configuration example of a physical cleaning device provided in the substrate processing apparatus.

FIG. 4 is a schematic cross-sectional view for describing a configuration example of the physical cleaning device 4B. In FIG. 4, the second chamber 8B is not shown.

The second spin chuck 6B is an example of a second substrate holding unit which holds the substrate Win the second posture. The second spin chuck 6B is also an example of a second substrate holding/rotating unit which rotates the substrate W around the rotational axis A2, while holding the substrate W in the second posture.

The second spin chuck 6B includes a second spin base 61 (second base) substantially in a circular shape in a plan view which faces from below the protected target surface W1 of the substrate W, a plurality of chuck pins 60 which are supported by the second spin base 61 to grip the peripheral edge portion of the substrate W, a second rotating shaft 62 which extends along the rotational axis A2 in a vertical direction and is configured so as to rotate integrally with the second spin base 61, a second spin motor 63 which rotates the second rotating shaft 62 around the rotational axis A2, and a second motor housing 64 which houses the second rotating shaft 62 and the second spin motor 63.

The plurality of chuck pins 60 are disposed on an upper surface of the second spin base 61 at intervals in a circumferential direction of the second spin base 61. An opening/closing unit 69 is provided for opening, closing, and driving the plurality of chuck pins 60. The plurality of chuck pins 60 are moved to a closing position by the opening/closing unit 69, thereby gripping the substrate W. The plurality of chuck pins 60 are moved to an opening position by the opening/closing unit 69, thereby releasing gripping of the substrate W. The plurality of chuck pins 60 positioned in the opening position release the gripping of the substrate W and also support from below the peripheral edge portion of the protected target surface W1 of the substrate W. The opening/closing unit 69 includes, for example, a link mechanism (not shown) and a driving source (not shown). The driving source includes, for example, an electric motor.

The substrate W is held horizontally by the plurality of chuck pins 60 in a predetermined holding position of the substrate W (position of the substrate W shown in FIG. 4, second holding position), with the peripheral edge portion of the substrate W being gripped.

An upper end portion of the second rotating shaft 62 is joined to the second spin base 61. The second spin base 61 is rotated by the second rotating shaft 62 being rotated by the second spin motor 63. The substrate W is thereby rotated around the rotational axis A2 together with the second spin base 61.

The second processing cup 7B includes a plurality of guards 65 which receive a liquid scattered from the substrate W held by the second spin chuck 6B, a plurality of cups 66 which receive a liquid guided downward by the plurality of guards 65, and an exhaust tank 67 which surrounds the guards 65 and the cups 66 in a plan view.

FIG. 4 shows an example in which the three guards 65 and the three cups 66 are disposed. The cup 66 corresponds to each of the guards 65 on a one-to-one basis, and each of the cups 66 receives the liquid guided downward by the corresponding guard 65.

A second guard raising/lowering unit 68 which individually raises and lowers the plurality of guards 65 is connected to the plurality of guards 65. The second guard raising/lowering unit 68 individually raises and lowers the plurality of guards 65 between a lower position and an upper position. The second guard raising/lowering unit 68 includes a plurality of actuators (not shown) which individually drive the raising and lowering of the plurality of guards 65. The actuator may be an electric motor or an air cylinder.

The physical cleaning device 4B further includes a lower nozzle 12 which supplies from the lower side a fluid to the protected target surface W1 of the substrate W and a scrub cleaning unit 70 (cleaning unit) which executes scrub cleaning on the cleaning target surface W2 of the substrate W. The scrub cleaning is a cleaning method in which a cleaning member such as a brush, etc., is brought into contact with the substrate W to effect cleaning by scrubbing and a physical force is thereby applied to the substrate W. The physical force in scrub cleaning is an impact (kinetic energy) which is imparted by a cleaning member such as a brush, etc., to the substrate W during cleaning by scrubbing.

The scrub cleaning unit 70 includes a cleaning liquid nozzle 71 which supplies a cleaning liquid such as DIW to the cleaning target surface W2 of the substrate W, a cleaning brush 72 (cleaning member) which is brought into contact with the cleaning target surface W2 of the substrate W to clean the cleaning target surface W2, a swinging arm 73 which holds the cleaning brush 72 at a leading end portion, and an arm driving mechanism 74 which swings the swinging arm 73.

A cleaning liquid piping 45 which guides the cleaning liquid into the cleaning liquid nozzle 71 is connected to the cleaning liquid nozzle 71. A cleaning liquid valve 55 which opens and closes a flow route inside the cleaning liquid piping 45 is interposed in the cleaning liquid piping 45. The cleaning liquid valve 55 is opened or closed, by which discharge and stopping of the cleaning liquid from the cleaning liquid nozzle 71 is switched.

The cleaning liquid which is discharged from the cleaning liquid nozzle 71 is not limited to DIW. The cleaning liquid discharged from the cleaning liquid nozzle 71 can be selected from the liquids mentioned as the rinse liquid used in the film coating/removing device 4A.

The cleaning brush 72 is an elastically deformable sponge brush which is formed with a synthetic resin such as PVA (polyvinyl alcohol). The cleaning brush 72 protrudes below from a brush holder 75 supported by the swinging arm 73. The cleaning brush 72 is not limited to a sponge brush but may be a brush having bristle tufts formed with a plurality of resin-made fibers.

The arm driving mechanism 74 is configured so as to be able to swing the swinging arm 73 along a horizontal plane or move the swinging arm 73 up and down. Because of this configuration, when the substrate W is held by the second spin chuck 6B and rotated, the cleaning brush 72 is pressed to the cleaning target surface W2 of the substrate W, and also a position at which it is pressed is moved in a radius direction of the substrate W, which makes it possible to scrub-clean the entirety of the cleaning target surface W2 of the substrate W.

The arm driving mechanism 74 includes, for example, a raising/lowering actuator (not shown) which moves the swinging arm 73 up and down and a swinging actuator (not shown) which swings the swinging arm 73. The raising/lowering actuator may be an electric motor or an air cylinder. The swinging actuator may be an electric motor or an air cylinder.

The lower nozzle 12 is inserted into a through hole 61b which is opened at an upper surface central portion of the second spin base 61. A discharge port 12a of the lower nozzle 12 is exposed from the upper surface of the second spin base 61. The discharge port 12a of the lower nozzle 12 faces from below the central portion of the protected target surface W1 of the substrate W.

The lower nozzle 12 is configured so as to discharge a gas such as nitrogen gas ($N_2$), etc. A first gas piping 46 which guides the gas into the lower nozzle 12 is connected to the lower nozzle 12. A first gas valve 56 which opens and closes a flow route of the first gas piping 46 is interposed in the first gas piping 46.

A gas flow route 13 which is an annular shape in a plan view is formed by a space between the lower nozzle 12 and the through hole 61b of the second spin base 61. The gas flow route 13 is connected to a second gas piping 47 inserted into a space between an inner peripheral surface of the second rotating shaft 62 and the lower nozzle 12. When a second gas valve 57 interposed in the second gas piping 47 is opened, a gas such as nitrogen gas is discharged from the gas flow route 13 toward a portion around the center of the protected target surface W1 of the substrate W. The lower nozzle 12 and the gas flow route 13 constitute a gas supplying unit which supplies a gas to a space between the protected target surface W1 and the second spin base 61. It is also possible to discharge a gas from only one of the lower nozzle 12 and the gas flow route 13.

The gas discharged from the lower nozzle 12 and the gas flow route 13 is not limited to nitrogen gas. The gas discharged from the gas flow route 13 may be air. Further, the gas discharged from the lower nozzle 12 and the gas flow route 13 may be an inert gas other than nitrogen gas. The inert gas is not limited to nitrogen gas and is a gas which is inert to the upper surface of the substrate W. Examples of the inert gas include rare gases such as argon, in addition to nitrogen gas.

Figure 5A:
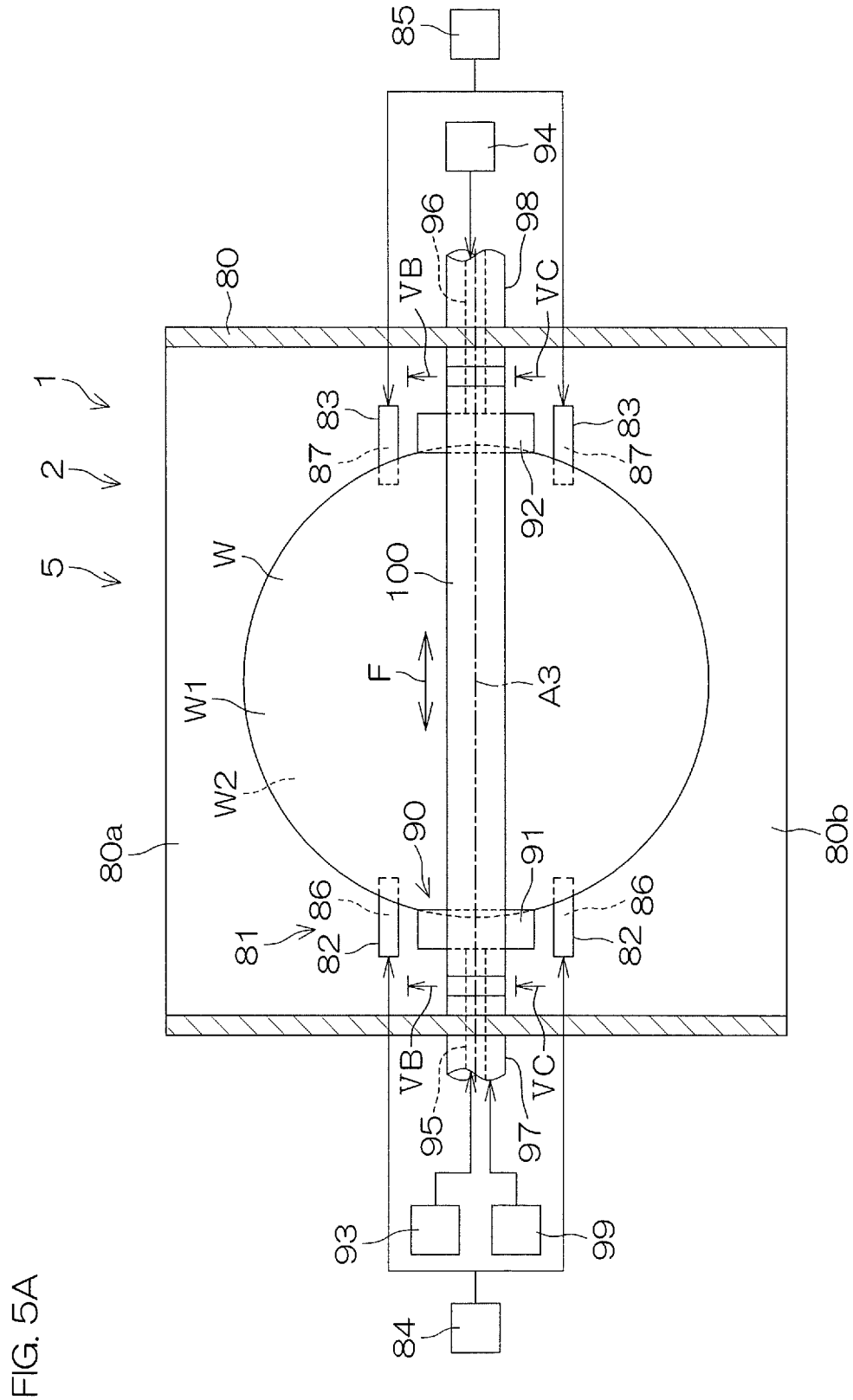
FIG. 5A is a schematic cross-sectional view for describing a configuration example of a turning unit provided in the substrate processing apparatus.
Figure 5B:
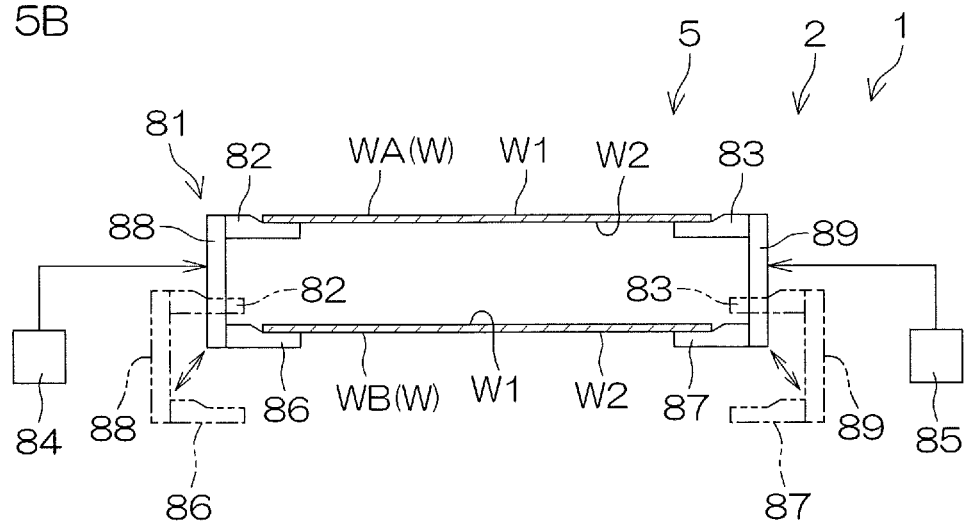
FIG. 5B is a cross-sectional view taken along line VB-VB shown in FIG. 5A.
Figure 5C:
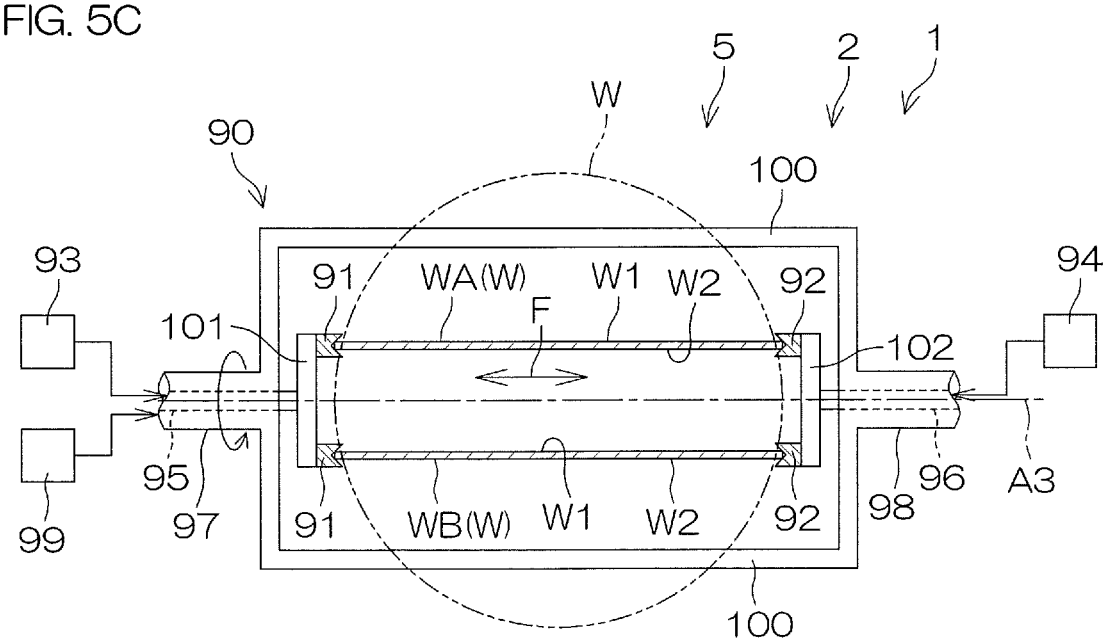
FIG. 5C is a cross-sectional view taken along line VC-VC shown in FIG. 5A.
Figure 5D:
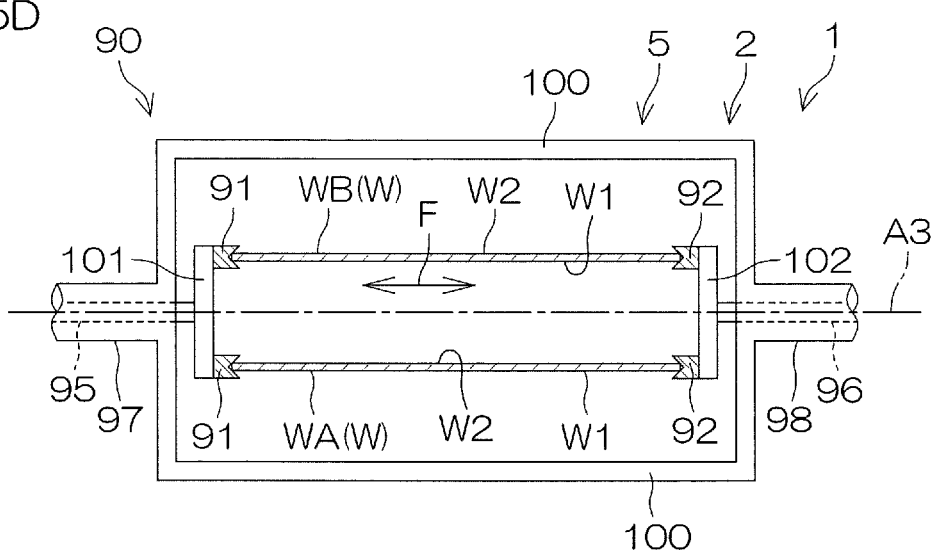
FIG. 5D is a cross-sectional view for describing a state that a substrate is turned around from a state shown in FIG. 5C.

FIG. 5A is a schematic cross-sectional view for describing a configuration example of the turning unit 5. FIG. 5B is a cross-sectional view taken along line VB-VB shown in FIG. 5A. FIG. 5C is a cross-sectional view taken along line VC-VC shown in FIG. 5A. FIG. 5D is a cross-sectional view for describing a state that the substrate W is turned around from a state shown in FIG. 5C.

With reference to FIG. 5A, the turning unit 5 includes a housing cabinet 80 which houses a substrate W, a supporting mechanism 81 which is brought into contact with a peripheral edge portion of a lower surface of the substrate W (the protected target surface W1 or the cleaning target surface W2 which is facing downward) to support the substrate W from below, and a clamping/turning mechanism 90 which clamps the peripheral edge portion of the substrate W inside the housing cabinet 80 and turns it around up and down.

The indexer robot IR and the main transfer robot CR (refer to FIG. 1A) are both able to gain access inside the housing cabinet 80. In the housing cabinet 80, there are formed a first opening 80a through which the pair of hands H of the indexer robot IR (refer to FIG. 1A) can gain access inside the housing cabinet 80 and a second opening 80b through which the pair of hands H of the main transfer robot CR (refer to FIG. 1A) can gain access inside the housing cabinet 80. In this preferred embodiment, two substrates W can be housed at the same time inside the housing cabinet 80 (refer to FIG. 5B).

With reference to FIG. 5A and FIG. 5B, the supporting mechanism 81 includes a plurality of first supporting members 82 which are brought into contact with a peripheral edge portion of the lower surface of the substrate W to support the substrate W from below and a plurality of second supporting members 83 which are brought into contact with the peripheral edge portion of the lower surface of the substrate W in a position to face the plurality of first supporting members 82 in a horizontal direction to support the substrate W from below. The plurality of first supporting members 82 and the second supporting members 83 support the substrate W from below so that the substrate W can be positioned in a predetermined reference position (upper reference position).

As shown in FIG. 5B, where the posture of the substrate W is the first posture, the first supporting member 82 and the second supporting member 83 are brought into contact with the peripheral edge portion of the cleaning target surface W2 of the substrate W. Although not shown, where the posture of the substrate W is the second posture, the first supporting member 82 and the second supporting member 83 are brought into contact with the peripheral edge portion of the protected target surface W1 of the substrate W.

The supporting mechanism 81 further includes a first actuator 84 which moves the plurality of first supporting members 82 between a supporting position at which the substrate W is supported and a retreat position which has retreated downward from the supporting position and a second actuator 85 which moves the plurality of second supporting members 83 between the supporting position at which the substrate W is supported and the retreat position which has retreated downward from the supporting position. The first actuator 84 moves the plurality of first supporting members 82 diagonally upward so as to move them close to the plurality of second supporting members 83 in a plan view when moving from the retreat position to the supporting position. The first actuator 84 may be an electric motor or an air cylinder. The second actuator 85 moves the plurality of second supporting members 83 diagonally upward so as to move them close to the plurality of first supporting members 82 in a plan view when moving from the retreat position to the supporting position. As with the first actuator 84, the second actuator 85 may also be an electric motor or an air cylinder.

In this preferred embodiment, two substrates W are housed at the same time inside the housing cabinet 80. Therefore, the supporting mechanism 81 includes a plurality of first lower supporting members 86 which are brought into contact with the peripheral edge portion of the lower surface of the substrate W at a place lower than the first supporting member 82 (first upper supporting member), thereby supporting the substrate W from below and a plurality of second lower supporting members 87 which are brought into contact with the peripheral edge portion of the lower surface of the substrate W in a position to face the plurality of first lower supporting members 86 in the horizontal direction at a place lower than the plurality of second supporting members 83 (second upper supporting members), thereby supporting the substrate W from below.

The first lower supporting member 86 and the second lower supporting member 87 support the substrate W so that the substrate W can be positioned in a predetermined reference position (lower reference position). As shown in FIG. 5B, where the posture of the substrate W is the first posture, the first lower supporting member 86 and the second lower supporting member 87 are brought into contact with the peripheral edge portion of the cleaning target surface W2 of the substrate W. Although not shown, where the posture of the substrate W is the second posture, the first lower supporting member 86 and the second lower supporting member 87 are brought into contact with the peripheral edge portion of the protected target surface W1 of the substrate W.

The supporting mechanism 81 further includes a plurality of first coupling portions 88 which couple a first supporting member 82 and a first lower supporting member 86 which corresponds to the first supporting member 82 and a plurality of second coupling portions 89 which couple a second supporting member 83 and a second lower supporting member 87 which corresponds to the second supporting member 83 (refer to FIG. 5B). Therefore, the plurality of first lower supporting members 86 are moved by the first actuator 84 in a diagonal direction together with the plurality of first supporting members 82. Further, the plurality of second lower supporting members 87 are moved by the second actuator 85 in a diagonal direction together with the plurality of second supporting members 83.

In FIG. 5C, the supporting mechanism 81 is not shown. With reference to FIG. 5A and FIG. 5C, the clamping/turning mechanism 90 includes a pair of first facing members 91 and a pair of second facing members 92 which respectively face the pair of first facing members 91 in a horizontal direction and clamp each of the substrates W positioned at the reference position together with the corresponding first facing members 91. The clamping/turning mechanism 90 includes a first supporting shaft 95 which supports the pair of first facing members 91 and extends in the horizontal direction, a second supporting shaft 96 which supports the pair of second facing members 92 and extends coaxially with the first supporting shaft 95, a first horizontal moving mechanism 93 which moves the first supporting shaft 95 in a facing direction F in which the first facing member 91 faces the second facing member 92 and a second horizontal moving mechanism 94 which moves the second supporting shaft 96 in the facing direction F. The first horizontal moving mechanism 93 is, for example, an electric motor or an air cylinder. The second horizontal moving mechanism 94 is an electric motor or an air cylinder.

The first facing member 91 is brought into contact with both the peripheral edge portion of the protected target surface W1 of the substrate W and the peripheral edge portion of the cleaning target surface W2. The second facing member 92 is brought into contact with both the peripheral edge portion of the protected target surface W1 of the substrate W and the peripheral edge portion of the cleaning target surface W2 on the opposite side of the first facing member 91 with respect to the center of the substrate W.

The clamping/turning mechanism 90 includes a first rotating shaft 97 through which the first supporting shaft 95 is inserted so as to rotate integrally with the first supporting shaft 95 around a central axis A3 of the first supporting shaft 95 and a second rotating shaft 98 through which the second supporting shaft 96 is inserted so as to rotate integrally with the second supporting shaft 96 around the central axis A3. The first rotating shaft 97 and the first supporting shaft 95 can rotate integrally, for example, by a recess-projection engagement. The second rotating shaft 98 and the second supporting shaft 96 can rotate integrally, for example, by a recess-projection engagement.

The clamping/turning mechanism 90 further includes a rotating mechanism 99 which rotates the first rotating shaft 97 around the central axis A3 and a pair of shaft coupling members 100 which couple the first rotating shaft 97 and the second rotating shaft 98. The rotating mechanism 99 includes, for example, an electric motor or an air cylinder.

The pair of first facing members 91 are symmetrically disposed, with the central axis A3 given as a center, and the pair of second facing members 92 are symmetrically disposed, with the central axis A3 given as a center. The clamping/turning mechanism 90 further includes a first coupling member 101 which couples the pair of first facing members 91 and the first supporting shaft 95 and a second coupling member 102 which couples the pair of second facing members 92 and the second supporting shaft 96.

The rotating mechanism 99 is driven, by which the first rotating shaft 97 and the second rotating shaft 98 are rotated, and the pair of first facing members 91 and the pair of second facing members 92 are rotated around the central axis A3.

Hereinafter, a description will be given of a turning operation of the substrate W by the turning unit 5.

First, as shown in FIG. 5B, one substrate W (hereinafter, referred to as "substrate WA") is placed on the plurality of first supporting members 82 and the plurality of second supporting members 83 by the indexer robot IR or the main transfer robot CR (refer to FIG. 1A), and one substrate W (hereinafter, referred to as "substrate WB") is placed on the plurality of first lower supporting members 86 and the plurality of second lower supporting members 87.

Hereinafter, for simplification, a description will be given of only the turning operation of the substrate WA. The turning operation of the substrate WB is the same as the operation that "the plurality of first supporting members 82" and "the plurality of second supporting members 83" in the following description are replaced by "the plurality of first lower supporting member 86" and "the plurality of second lower supporting member 87."

In a state that the substrate WA is placed on the plurality of first supporting members 82 and the plurality of second supporting members 83, the first facing member 91 and the second facing member 92 are brought close to each other, by which the substrate WA is clamped by the first facing member 91 and the second facing member 92 between them.

In a state that the substrate WA is clamped by the first facing member 91 and the second facing member 92, the plurality of first supporting members 82 and the plurality of second supporting members 83 are moved diagonally downward toward the retreat position, and the plurality of first supporting members 82 and the plurality of second supporting members 83 can retreat. Thereby, the substrate WA is delivered between the first facing member 91 and the second facing member 92.

In a state that the plurality of first supporting members 82 and the plurality of second supporting members 83 can retreat, the first facing member 91 and the second facing member 92 are rotated, thereby the substrate WA is turned around. In FIG. 5C which shows a state before it is turned around, the posture of the substrate WA is the first posture, and in FIG. 5D which shows a state after it is turned around, the posture thereof is the second posture.

After the substrate WA has been turned around, the plurality of first lower supporting members 86 and the plurality of second lower supporting members 87 are moved diagonally upward toward the supporting position, by which the substrate WA is supported from below by the plurality of first lower supporting members 86 and the plurality of second lower supporting members 87. In a state that the substrate WA is supported from below by the plurality of first lower supporting members 86 and the plurality of second lower supporting members 87, the first facing member 91 and the second facing member 92 are moved so as to be separated from each other, by which the substrate WA is delivered to the plurality of first lower supporting members 86 and the plurality of second lower supporting members 87. In this state, the indexer robot IR and the main transfer robot CR (refer to FIG. 1A) can gain access to the substrate WA.

By the same operation, the posture of the substrate WA can be also changed from the second posture to the first posture. Thus, the turning unit 5 can turn around the substrate W, with the peripheral edge portion of the substrate W clamped by the first facing member 91 and the second facing member 92, so that the posture of the substrate W can be changed to one of the first posture and the second posture.

The turning unit 5 can support the substrate W from below by using the supporting mechanism 81. Thus, it also functions as a placing unit in which the substrate W is temporarily placed for delivering the substrate W between the indexer robot IR and the main transfer robot CR without turning around the substrate W.

Figure 6:
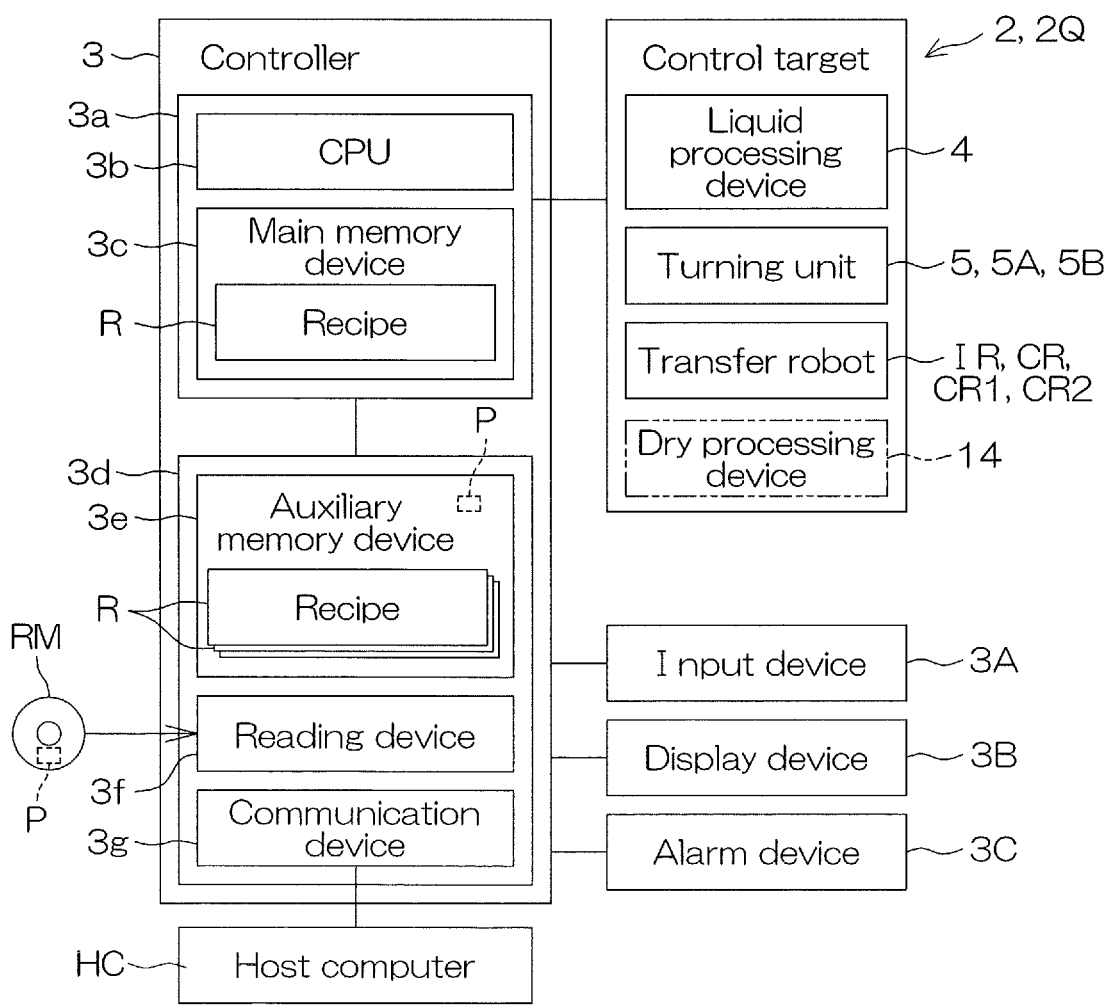
FIG. 6 is a block diagram for describing a configuration example concerning control of the substrate processing system.

FIG. 6 is a block diagram for describing a configuration example concerning control of the substrate processing system 1. The controller 3 is a computer which includes a computer main body 3a and a peripheral device 3d connected to the computer main body 3a. The computer main body 3a includes a CPU 3b (central processing unit) which executes various commands and a main memory device 3c which stores information. The peripheral devices 3d include an auxiliary memory device 3e which stores information such as programs P, a reading device 3f which reads information from a removable medium RM, and a communication device 3g which communicates with other devices such as a host computer.

The controller 3 is connected to an input device 3A, a display device 3B, and an alarm device 3C. The input device 3A is operated when operators such as users and personnel in charge of maintenance input information to the substrate processing apparatus 2. The information is displayed on a screen of the display device 3B. The input device 3A may be any one of a keyboard, a pointing device, and a touch panel or may be any devices other than these. A touch panel display which acts as the input device 3A and the display device 3B may be provided in the substrate processing apparatus 2. The alarm device 3C issues an alarm by using one or more of light, sound, text and graphics. Where the input device 3A is a touch panel display, the input device 3A may also serve as the alarm device 3C.

The CPU 3b executes the programs P stored in the auxiliary memory device 3e. The programs P inside the auxiliary memory device 3e may be those installed in advance in the controller 3, those sent to the auxiliary memory device 3e through the reading device 3f from the removable medium RM, or those sent to the auxiliary memory device 3e from an external device such as the host computer HC through the communication device 3g.

The auxiliary memory device 3e and the removable medium RM are non-volatile memories which retain memory when power is not supplied. The auxiliary memory device 3e is, for example, a magnetic storage device such as a hard disk drive. The removable medium RM is, for example, an optical disk such as a compact disk or a semiconductor memory such as a memory card. The removable medium RM is an example of a computer-readable recording medium in which the programs P are recorded. The removable medium RM is a non-temporary tangible recording medium.

The auxiliary memory device 3e stores a plurality of recipes R. The recipe R is information that prescribes processing content, processing conditions, and processing procedures of a substrate W. The plurality of recipes R are different from each other in at least one of the processing content, processing conditions, and processing procedures of the substrate W.

The controller 3 controls the liquid processing device 4, the turning unit 5, the indexer robot IR, the main transfer robot CR, etc., so that the substrate W can be processed according to the recipes R set in the main memory device 3c. Each of the following steps is executed by the controller 3 which controls these configurations. In other words, the controller 3 is programmed so as to execute each of the following steps.

Figure 7:
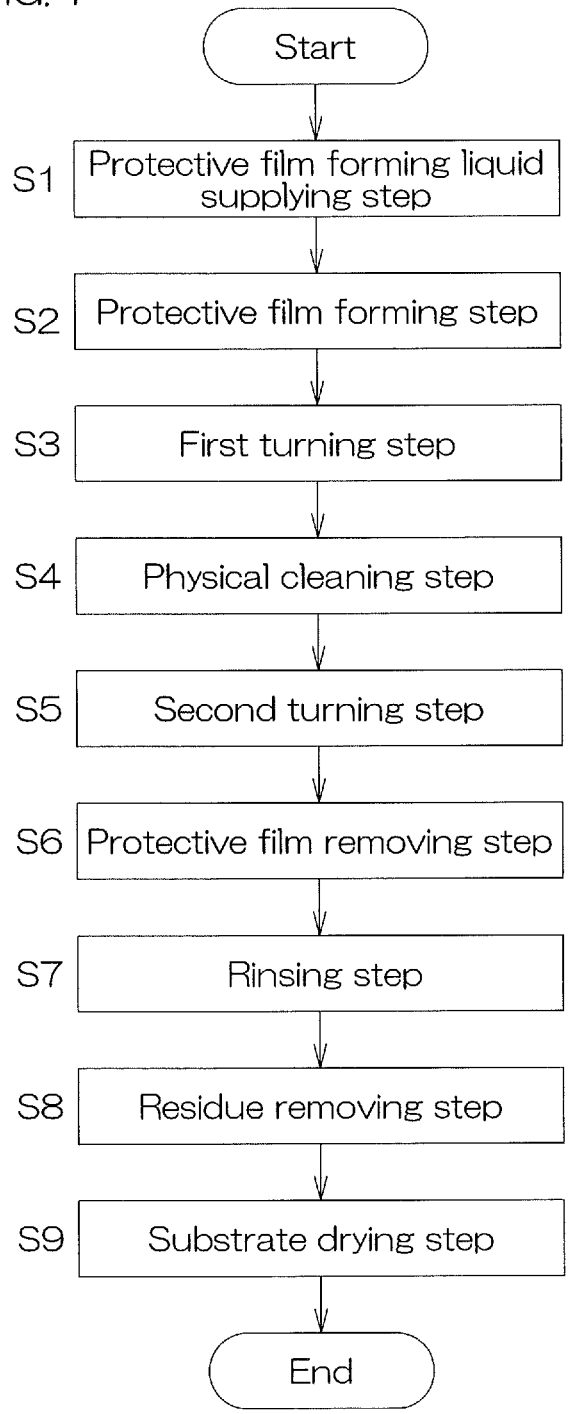
FIG. 7 is a flowchart for describing a flow of specific substrate processing by the substrate processing system.

FIG. 7 is a flowchart for describing an example of the substrate processing by the substrate processing system 1. FIG. 7 mainly shows the processing which is realized by the controller 3 that executes the programs. FIG. 8A to FIG. 8H are each a schematic view for describing conditions of each step of the substrate processing by the substrate processing system 1.

In the substrate processing by the substrate processing system 1, for example, as shown in FIG. 7, a protective film forming liquid supplying step (Step S1), a protective film forming step (Step S2), a first turning step (Step S3), a physical cleaning step (Step S4), a second turning step (Step S5), a protective film removing step (Step S6), a rinsing step (Step S7), a residue removing step (Step S8), and a substrate drying step (Step S9) are executed in that order.

Hereinafter, a description will be given of the substrate processing by the substrate processing system 1 mainly with reference to FIG. 1A to FIG. 4 and FIG. 7. FIG. 8A to FIG. 8H will be referenced whenever necessary.

First, an unprocessed substrate W is carried out from the carrier C by the indexer robot IR. The indexer robot IR delivers the substrate W via the turning unit 5 to the main transfer robot CR. The main transfer robot CR transfers the substrate W received from the indexer robot IR inside the film coating/removing device 4A and delivers it to the first spin chuck 6A.

As described previously, the substrate W is housed in the first posture in the carrier C (refer to FIG. 2). Therefore, even after the substrate W has been delivered to the first spin chuck 6A, the posture thereof is kept in the first posture.

The substrate W is delivered from the main transfer robot CR to the first spin chuck 6A, by which the substrate W is placed on the suction surface 21a of the first spin base 21.

Figure 8A:
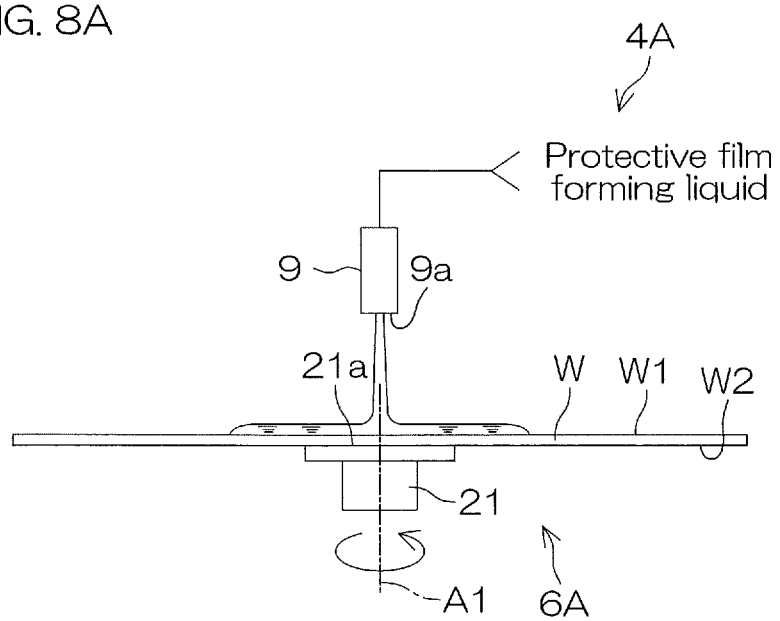
FIG. 8A to FIG. 8H are each a schematic view for describing conditions of a substrate when the substrate processing is performed as an example.

In a state that the substrate W is placed on the suction surface 21a, the suction valve 28 is opened. Thereby, the cleaning target surface W2 of the substrate W is suctioned from below to the suction surface 21a of the first spin base 21. Thereby, as shown in FIG. 8A, the substrate W is held in the first posture in the first holding position (first substrate holding step).

Before the suction valve 28 is opened, the substrate W placed on the first spin base 21 may be centered by the centering unit 29 so that the central portion of the protected target surface W1 of the substrate W can be substantially aligned with the rotational axis A1.

Next, after the main transfer robot CR has retreated outside the film coating/removing device 4A, the protective film forming liquid supplying step (Step S1) is started. In the protective film forming liquid supplying step, first, the first spin motor 23 rotates the first spin base 21. Thereby, the substrate W held in the first holding position is rotated (first substrate rotating step).

Figure 8B:
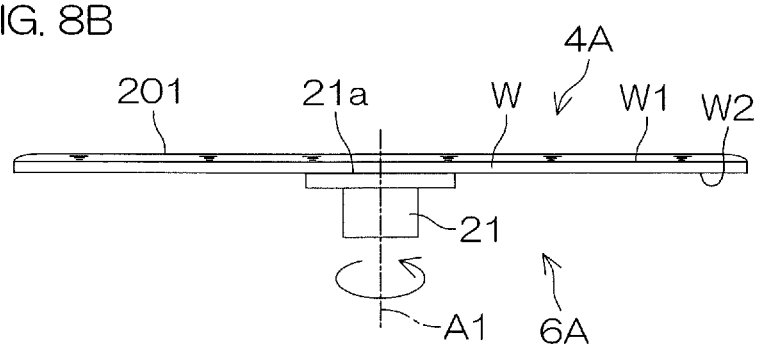

Thereafter, the nozzle moving unit 37 moves the moving nozzle 9 to a processing position. The processing position of the moving nozzle 9 is, for example, a central position. In a state that the moving nozzle 9 is positioned in the processing position, the protective film forming liquid valve 51 is opened. Thereby, as shown in FIG. 8A, a protective film forming liquid is supplied (discharged) from the discharge port 9a of the moving nozzle 9 toward the central portion of the protected target surface W1 of the substrate W in a rotating state (protective film forming liquid supplying step, protective film forming liquid discharging step). The protective film forming liquid supplied to the protected target surface W1 of the substrate W spreads across the entirety of the protected target surface W1 by a centrifugal force. Thereby, as shown in FIG. 8B, a liquid film 201 of the protective film forming liquid is formed on the entirety of the protected target surface W1 of the substrate W (liquid film forming step).

Next, the protective film forming step (Step S2) is executed. In the protective film forming step, while the liquid film 201 of the protective film forming liquid is made thin, evaporation of the solvent in the liquid film 201 is accelerated, by which a protective film 200 in a semi-solid state or a solid state is formed (refer to FIG. 8C) on the protected target surface W1.

In the protective film forming step, the liquid film 201 of the protective film forming liquid on the substrate W is made thin in thickness (film thinning step). Specifically, the protective film forming liquid valve 51 is closed, and supply of the protective film forming liquid to the substrate W is then stopped. The substrate W is rotated in a state that supply of the protective film forming liquid to the protected target surface W1 is stopped. Therefore, a part of the protective film forming liquid is eliminated from the protected target surface W1 (spin off step). Thereby, the liquid film 201 on the substrate W is made appropriate in thickness. After the protective film forming liquid valve 51 is closed, the moving nozzle 9 is moved to the home position by the nozzle moving unit 37.

Figure 8C:
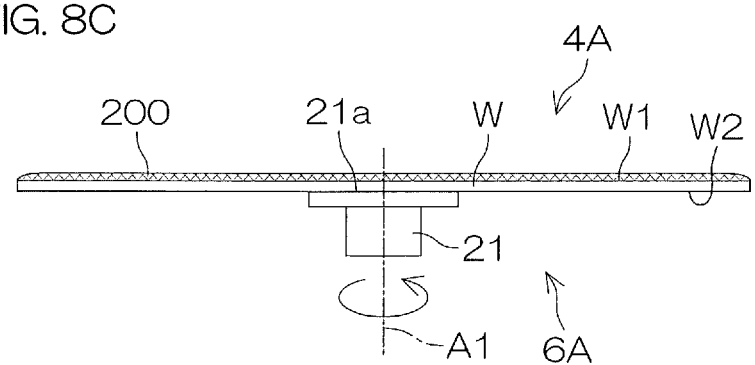

A centrifugal force resulting from rotation of the substrate W not only contributes to elimination of the protective film forming liquid from the protected target surface W1 of the substrate W but also acts on a gas in contact with the liquid film 201. Due to actions of the centrifugal force, an air flow in which the gas moves from the center side of the protected target surface W1 of the substrate W to the peripheral edge side is formed. A solvent in a gaseous state which is in contact with the liquid film 201 is eliminated from an atmosphere in contact with the substrate W by this air flow. Therefore, evaporation (volatilization) of the solvent from the protective film forming liquid on the substrate W is accelerated and, as shown in FIG. 8C, the protective film 200 is formed (solvent evaporation step, protective film forming step). As described above, after supply of the protective film forming liquid, the protective film 200 is quickly formed on the protected target surface W1. In other words, the protective film 200 is coated on the protected target surface W1 by supply of the protective film forming liquid (protective film coating step).

Prior to start of the protective film forming step, as shown in FIG. 8A, the protective film forming liquid valve 51 may be closed in a state that the protective film forming liquid is present only at the central portion of the protected target surface W1. In this case, the protective film forming liquid spreads across the entirety of the protected target surface W1 by the centrifugal force resulting from rotation of the substrate W, and the liquid film 201 is made thin. It is therefore possible to decrease the amount of the protective film forming liquid that is removed from the protected target surface W1.

When the protective film 200 is coated, the central portion of the cleaning target surface W2 is suctioned by the suction surface 21a of the first spin base 21. Therefore, the first spin chuck 6A can hold the substrate W without providing a member that is brought into contact with the peripheral edge portion of the substrate W. That is, the protective film 200 can be coated without providing a member that prevents coating of the protective film 200 in the vicinity of the peripheral edge portion of the protected target surface W1. Therefore, it is possible to improve uniformity of the protective film 200 with respect to the peripheral edge portion of the protected target surface W1. In other words, the protected target surface W1 of the substrate W can be satisfactorily protected.

Figure 8D:
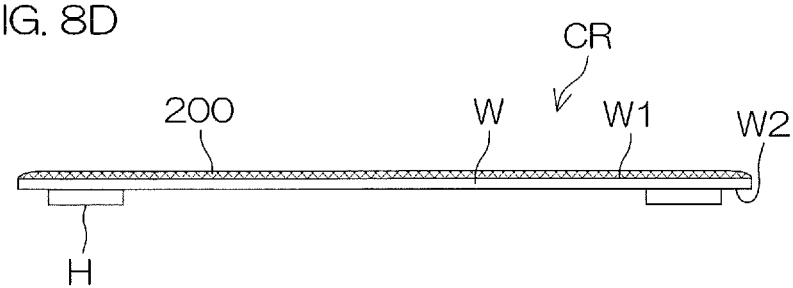
Figure 8E:
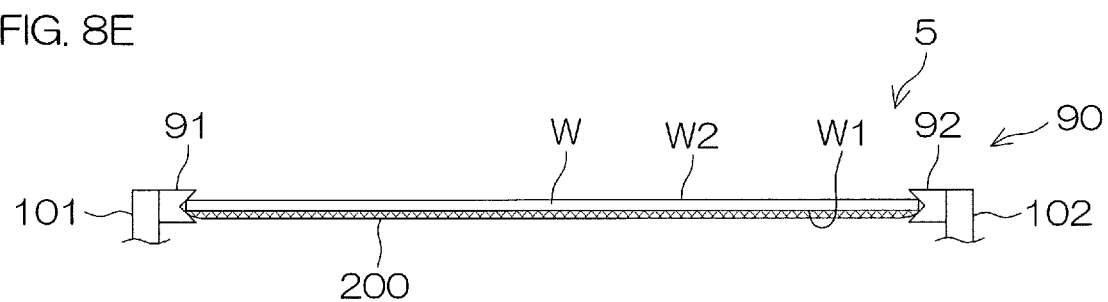

In a state that the protective film 200 is formed on the protected target surface W1, the substrate W is carried out from the film coating/removing device 4A by the main transfer robot CR. Specifically, after rotation of the substrate W is stopped and also the suction valve 28 is closed, the main transfer robot CR receives the substrate W from the first spin chuck 6A. As shown in FIG. 8D, the substrate W is transferred by the main transfer robot CR in a state that the hand H is in contact with the peripheral edge portion of the cleaning target surface W2. The substrate W carried out from the film coating/removing device 4A is carried into the turning unit 5 by the main transfer robot CR. The substrate W which has been carried into the turning unit 5 is turned around by the turning unit 5 so that the posture of the substrate W can be changed from the first posture to the second posture (Step S3: first turning step). FIG. 8E shows conditions of the substrate W after it has been turned around by the turning unit 5. In detail, the turning unit 5 turns around the substrate W while in contact with the peripheral edge portion of the substrate W so that the posture of the substrate W in a state that the protective film 200 is formed on the protected target surface W1 can be changed from the first posture to the second posture. The turning unit 5 functions as a first turning unit.

Figure 8F:
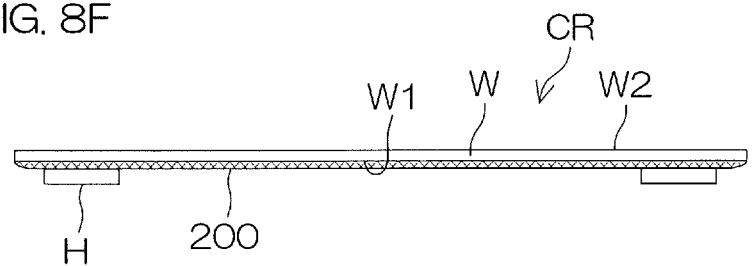

The substrate W which has been turned around by the turning unit 5 is carried out from the turning unit 5 by the main transfer robot CR. As shown in FIG. 8F, the substrate W is transferred by the main transfer robot CR in a state that the hand H is in contact with the peripheral edge portion of the protected target surface W1. The substrate W is carried into the physical cleaning device 4B by the main transfer robot CR and delivered to the second spin chuck 6B. Thereby, the substrate W is placed from above on the plurality of chuck pins 60 positioned in the opening position in a state that the protected target surface W1 is facing downward. The main transfer robot CR places the substrate W on the plurality of chuck pins 60 and, thereafter, retreats outside the physical cleaning device 4B.

Figure 8G:
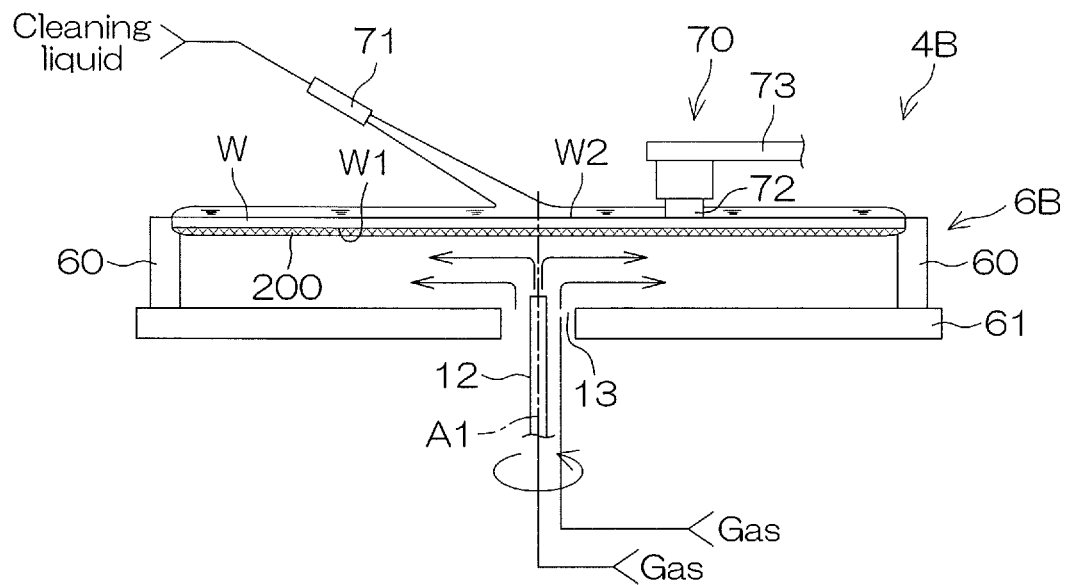

In a state that the substrate W is placed on the plurality of chuck pins 60, the plurality of chuck pins 60 move to the closing position. Thereby, the second spin chuck 6B holds the substrate W in a state that the posture thereof is changed to the second posture by the turning unit 5. In detail, as shown in FIG. 8G, the plurality of chuck pins 60 are brought into contact with the peripheral edge portion of the protected target surface W1 and grip the substrate W, thereby holding the substrate W in the second posture in the second holding position (second substrate holding step). Since the protective film 200 is coated at the peripheral edge portion of the protected target surface W1, the plurality of chuck pins 60 can grip the peripheral edge portion of the substrate W without being directly brought into contact with the peripheral edge portion of the protected target surface W1. It is therefore possible to prevent with a high degree of reliability contamination of the protected target surface W1 resulting from the substrate W which is held.

In a state that the substrate W is gripped by the plurality of chuck pins 60, the second spin motor 63 rotates the second spin base 61. Thereby, the substrate W which is held in the second holding position is rotated (second substrate rotating step).

Next, the physical cleaning step (Step S4) which physically cleans the cleaning target surface W2 of the substrate W is started. In the physical cleaning step, the scrub cleaning unit 70 cleans the cleaning target surface W2 of the substrate W in a state that the protective film 200 is formed on the protected target surface W1 and that is also held by the second spin chuck 6B. In detail, scrub cleaning (physical cleaning) is executed in which while the cleaning liquid is supplied to the cleaning target surface W2 of the substrate W, the cleaning brush 72 is pressed on the cleaning target surface W2 to clean the cleaning target surface W2.

More specifically, in a state that the substrate W is rotated, the cleaning liquid valve 55 is opened. Thereby, the cleaning liquid is supplied from the cleaning liquid nozzle 71 toward the central portion of the cleaning target surface W2 of the substrate W. The cleaning liquid supplied to the cleaning target surface W2 spreads across the entirety of the cleaning target surface W2 of the substrate W due to a centrifugal force. As shown in FIG. 8G, while the cleaning liquid is supplied to the cleaning target surface W2 of the substrate W, the cleaning brush 72 pressed to the cleaning target surface W2 is moved horizontally, and scrub cleaning to the cleaning target surface W2 is thus executed. Thereby, the cleaning brush 72 exerts a physical force to the cleaning target surface W2 to clean the cleaning target surface W2.

The scrub cleaning imparts an impact energy larger than that of cleaning by a liquid in a continuous flow to the cleaning target surface W2. Therefore, as compared with the cleaning by the liquid in the continuous flow, contamination substances are easily scattered. Where the protective film 200 is coated on the entirety of the protected target surface W1, while the cleaning target surface W2 is sufficiently cleaned by the physical cleaning, contamination of the protected target surface W1 resulting from physical cleaning can be prevented.

Further, when the scrub cleaning is executed, a gas which is discharged from the lower nozzle 12 and the gas flow route 13 is supplied to a space between the protected target surface W1 and the second spin base 61 (gas supplying step).

Since the gas is supplied to the space between the second spin base 61 and the protected target surface W1, an air flow which moves from the space to an exterior of the space is formed. Therefore, it is possible to prevent contamination substances scattered into an atmosphere from flowing into the space between the second spin base 61 and the protected target surface W1 during scrub cleaning of the cleaning target surface W2 and adhering to the protected target surface W1. It is also possible to prevent the cleaning liquid adhered to the cleaning target surface W2 of the substrate W from moving to the protected target surface W1 of the substrate W. Consequently, the protected target surface W1 can be satisfactorily protected.

The substrate W of which the cleaning target surface W2 has been physically cleaned is carried out from the physical cleaning device 4B by the main transfer robot CR. Specifically, rotation of the substrate W is stopped and also the plurality of chuck pins 60 are moved to the opening position, and the main transfer robot CR thereafter receives the substrate W from the second spin chuck 6B. The substrate W is transferred by the main transfer robot CR in a state that the hand H is in contact with the peripheral edge portion of the protected target surface W1 (refer to FIG. 8F described above).

The substrate W carried out from the physical cleaning device 4B is carried into the turning unit 5 by the main transfer robot CR. The substrate W carried into the turning unit 5 is turned around by the turning unit 5 so that the posture of the substrate W can be changed to the first posture (Step S5: second turning step). In detail, the turning unit 5 turns around the substrate W while in contact with the peripheral edge portion of the substrate W so that the posture of the substrate W in a state in which the protective film 200 is formed on the protected target surface W1 can be changed from the second posture to the first posture. The turning unit 5 functions as a second turning unit.

Figure 8H:
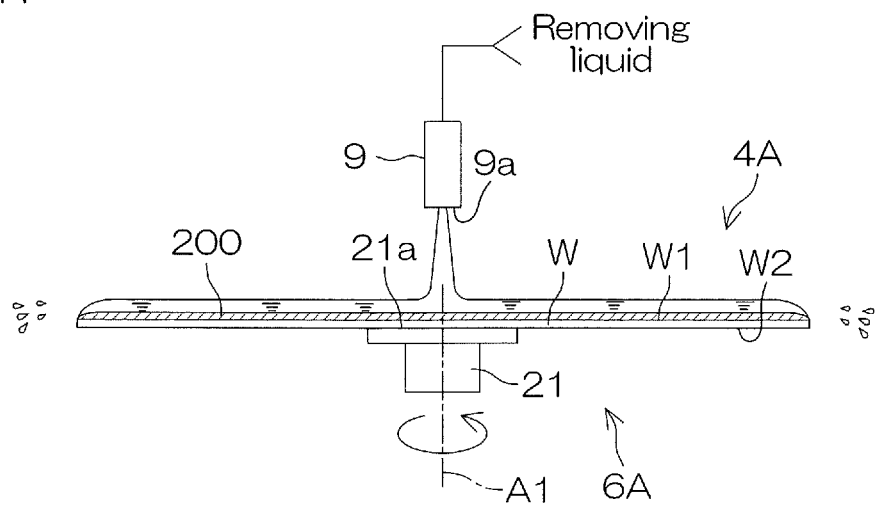

The substrate W which has been turned around by the turning unit 5 is carried out from the turning unit 5 by the main transfer robot CR. The substrate W is transferred by the main transfer robot CR in a state that the hand H is in contact with the peripheral edge portion of the cleaning target surface W2 (refer to FIG. 8D described above). The substrate W is carried into the film coating/removing device 4A by the main transfer robot CR and delivered to the first spin chuck 6A. In detail, the substrate W is placed on the suction surface 21a of the first spin base 21. In this state, the suction valve 28 is opened, by which the cleaning target surface W2 of the substrate W is suctioned from below by the suction surface 21a of the first spin base 21. Thereby, as shown in FIG. 8H, the substrate W is held in the first posture in the first holding position (third substrate holding step).

The first spin chuck 6A holds the substrate W in a state that the posture thereof is changed by the turning unit 5 from the second posture to the first posture. The first spin base 21 functions as a third base, and the first spin chuck 6A functions as a third substrate holding unit which holds the substrate W in a third holding position (position of the substrate W shown in FIG. 3). In this preferred embodiment, the third holding position is the same position as the first holding position.

Next, after the main transfer robot CR has retreated outside the film coating/removing device 4A, the protective film removing step (Step S6) is started. In the protective film removing step, first, the first spin motor 23 rotates the first spin base 21. Thereby, the substrate W which is held horizontally is rotated (third substrate rotating step).

Thereafter, the nozzle moving unit 37 moves the moving nozzle 9 to the processing position (central position). In a state that the moving nozzle 9 is positioned in the processing position, the removing liquid valve 52 is opened. Thereby, as shown in FIG. 8H, the removing liquid is supplied (discharged) from the discharge port 9a of the moving nozzle 9 toward the central portion of the protected target surface W1 of the substrate W in a rotating state (removing liquid supplying step, removing liquid discharging step). The moving nozzle 9 supplies the removing liquid to the protected target surface W1 of the substrate W in a state that the posture thereof is changed from the second posture to the first posture by the turning unit 5 and the substrate W is also held by the first spin chuck 6A.

The removing liquid supplied to the protected target surface W1 of the substrate W spreads across the entirety of the protected target surface W1 by a centrifugal force and is discharged from the peripheral edge portion of the substrate W outside the substrate W. The protective film 200 is removed from the protected target surface W1 by actions of the removing liquid. In detail, the protective film 200 on the protected target surface W1 is peeled and eliminated together with the removing liquid outside the substrate W. Where the removing liquid is supplied from above toward the protected target surface W1, the removing liquid can spread more easily and evenly across the entirety of the protected target surface W1 than a configuration in which the removing liquid is supplied from below to the protected target surface W1. Consequently, the protective film 200 can be satisfactorily removed from the protected target surface W1.

Further in the protective film removing step, the protective film 200 is removed by the same member as that used in coating the protective film 200, that is, in a state of being held by the first spin chuck 6A. Consequently, as compared with a case that another substrate holding unit is provided for removing the protective film 200, the substrate processing system 1 can be made smaller.

After the protective film removing step (Step S6), the rinsing step (Step S7) in which the removing liquid is washed away by the rinse liquid from the protected target surface W1 of the substrate W and the residue removing step (Step S8) in which residues of the protective film 200 are removed by the residue removing liquid from the protected target surface W1 of the substrate W are sequentially executed.

In the rinsing step, the rinse liquid is supplied (discharged) from the fixed nozzle 10 toward the central portion of the protected target surface W1 of the substrate W in a rotating state (rinse liquid supplying step, rinse liquid discharging step). In the residue removing step, the residue removing liquid is supplied (discharged) from the central nozzle 11 toward the central portion of the protected target surface W1 of the substrate W in a rotating state (residue removing liquid supplying step, residue removing liquid discharging step).

There is a case that residues of the protective film 200 may remain on the protected target surface W1 of the substrate W even after the protective film has been peeled by the removing liquid from the substrate W and eliminated from the substrate W. The residue removing liquid supplied to the protected target surface W1 of the substrate W dissolves the residues of the protective film 200. The residue removing liquid supplied from the central nozzle 11 to the protected target surface W1 of the substrate W spreads across the entirety of the protected target surface W1 of the substrate W by a centrifugal force and is eliminated from the peripheral edge portion of the substrate W outside the substrate W. The residue removing liquid dissolves the residues of the protective film while spreading on the protected target surface W1. Thereby, the residues of the protective film on the substrate W are removed.

After the residue removing step, the first spin motor 23 accelerates rotation of the substrate W and rotates the substrate W at a high rotational speed (for example, several thousand rotations per minute) (substrate drying step: Step S9). Thereby, the liquid is removed from the substrate W, and the substrate W is dried. After a predetermined period of time has elapsed from the start of high speed rotation of the substrate W, the rotation of the first spin motor 23 is stopped. Thereby, the rotation of the substrate W is stopped.

Thereafter, the main transfer robot CR enters into the film coating/removing device 4A, receives the substrate W which has been processed from the first spin chuck 6A and carries it out of the film coating/removing device 4A. The substrate W carried out from the film coating/removing device 4A is delivered via the turning unit 5 from the main transfer robot CR to the indexer robot IR. The indexer robot IR receives the substrate W from the turning unit 5 and houses the substrate W in the carrier C, with the posture of the substrate W kept in the first posture (refer to FIG. 1B as well).

Figure 9A:
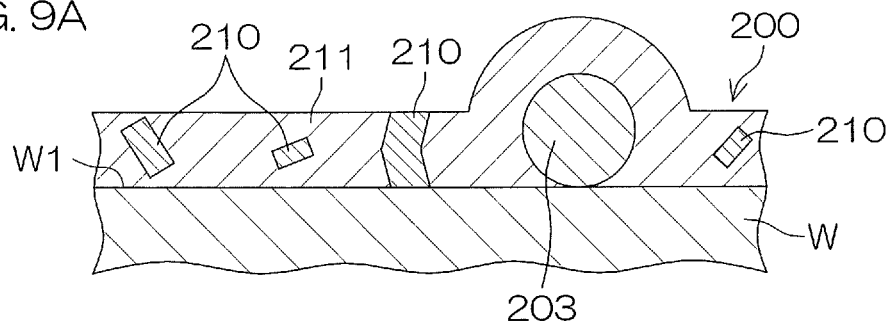
FIG. 9A to FIG. 9C are each a schematic view for describing conditions that a protective film is removed from a protected target surface of the substrate.
Figure 9B:
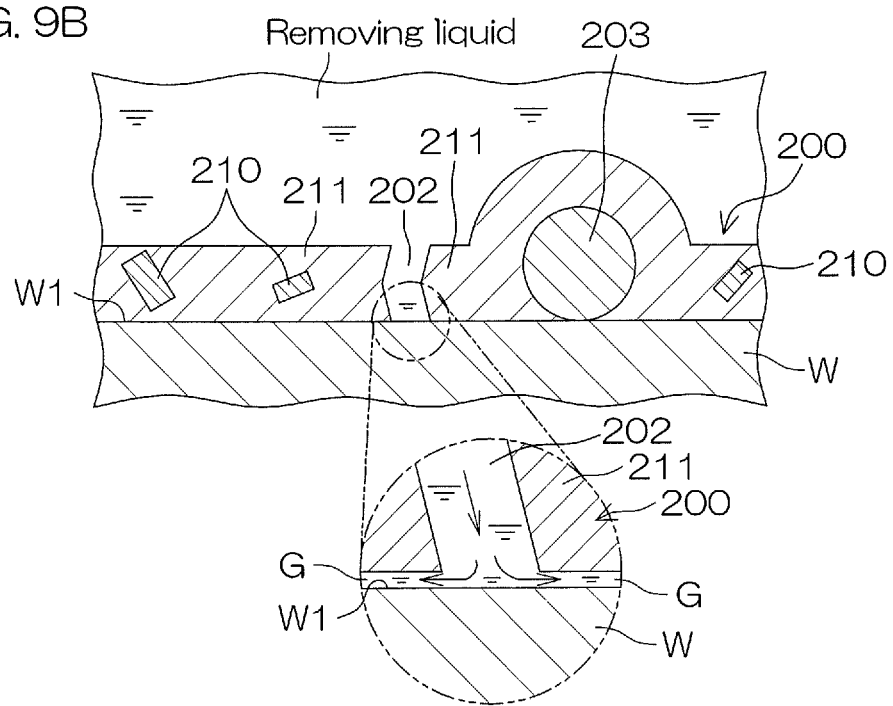
Figure 9C:
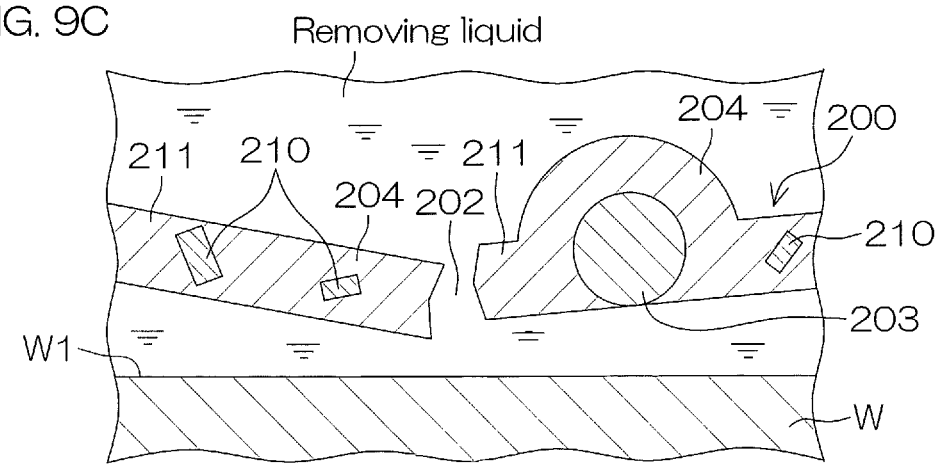

Next, with reference to FIG. 9A to FIG. 9C, conditions that the protective film 200 is removed from the substrate W will be described in detail. FIG. 9A to FIG. 9C are each a schematic view for describing the conditions that the protective film 200 is removed from the substrate W.

There is a case that particles 203 may adhere to the protected target surface W1 of the substrate W. The protective film forming liquid hardens to such an extent that keeps a certain shape, by which the particles 203 are peeled from the protected target surface W1 and taken into the protective film 200. Therefore, as shown in FIG. 9A, the protective film 200 formed in the protective film forming step (Step S2) holds the particles 203 which adhere to the protected target surface W1 of the substrate W.

Prior to execution of the protective film removing step, the protective film 200 contains a high solubility component in a solid state (high solubility solids 210) and a low solubility component in a solid state (low solubility solids 211). The high solubility solids 210 and the low solubility solids 211 are formed by evaporation of at least a portion of a solvent contained in the protective film forming liquid.

With reference to FIG. 9B, the high solubility solids 210 are selectively dissolved by the removing liquid. That is, the protective film 200 is partially dissolved (dissolving step, partially dissolving step).

"The high solubility solids 210 are selectively dissolved" does not mean that only the high solubility solids 210 in a solid state are dissolved. "The high solubility solids 210 are selectively dissolved" means that although the low solubility solids 211 in a solid state are also slightly dissolved, most of the high solubility solids 210 are dissolved.

With a selective dissolution of the high solubility solids 210 as a starting point, a through hole 202 as a removing liquid route is formed at a portion of the protective film 200 where the high solubility solids 210 are unevenly present (through hole forming step).

This does not mean that only the high solubility solids 210 are present at the portion where the high solubility solids 210 are unevenly present but it means that the low solubility solids 211 are also present. The removing liquid dissolves not only the high solubility solids 210 but also the low solubility solids 211 around the high solubility solids 210, by which the through hole 202 is formed in an accelerated manner.

The through hole 202 is formed, for example, in the size having a diameter of several nanometers in a plan view. The through hole 202 is not required to be formed clearly so as to be observable. That is, the removing liquid route that moves the removing liquid up to the protected target surface W1 of the substrate W from an upper surface of the protective film 200 may be only formed in the protective film 200. The removing liquid route may penetrate the protective film 200 as a whole.

Here, where a solvent remains appropriately in the protective film 200, the removing liquid partially dissolves the protective film 200 while dissolving into the solvent remaining in the protective film 200. In detail, the removing liquid dissolves the high solubility solids 210 in the protective film 200 while dissolving into the solvent remaining in the protective film 200, thereby forming the through hole 202 (gap, route). Therefore, the removing liquid easily enters into the protective film 200 (dissolving/entry step). The removing liquid passes through the through hole 202 and reaches an interface between the substrate Wand the low solubility solids 211.

The removing liquid which has reached the protected target surface W1 of the substrate W acts on an interface between the protective film 200 and the substrate W, peels the protective film 200 and removes the peeled protective film 200 from the protected target surface W1 of the substrate W (peeling/removing step).

In detail, the low solubility solids 211 are low in solubility to the removing liquid and most of the low solubility solids 211 are kept in a solid state. Therefore, the removing liquid which has reached the vicinity of the protected target surface W1 of the substrate W via the through hole 202 slightly dissolves a portion of the low solubility solids 211 in the vicinity of the protected target surface W1 of the substrate W. Thereby, as shown in the enlarged view of FIG. 9B, while gradually dissolving the low solubility solids 211 in the vicinity of the protected target surface W1 of the substrate W, the removing liquid enters into a gap G between the protective film 200 and the protected target surface W1 of the substrate W (removing liquid entry step).

Then, for example, with the peripheral edge of the through hole 202 as a starting point, cracks are formed in the protective film 200. Therefore, the high solubility solids 210 are also referred to as a crack generating component. The protective film 200 is divided by formation of the cracks and made into film pieces 204. As shown in FIG. 9C, the film pieces 204 of the protective film 200 are peeled from the substrate W in a state that the particles 203 are held (protective film dividing step, protective film removing step).

Then, the removing liquid is supplied continuously, by which the protective film 200 made into the film pieces 204 is washed away by the removing liquid in a state that the particles 203 are held. In other words, the film pieces 204 which hold the particles 203 are pushed to the outside of the substrate W and eliminated from the protected target surface W1 of the substrate W (protective film eliminating step, removal object eliminating step). Thereby, it is possible to satisfactorily clean the protected target surface W1 of the substrate W.

As described above, the removing liquid is supplied to the protected target surface W1 of the substrate W, thereby dissolving the high solubility solids 210 and peeling the protective film 200 from the protected target surface W1 of the substrate.

As described above, where the protective film forming liquid which contains the high solubility component and the low solubility component is used, the removing liquid can quickly act on the interface between the protective film 200 and the substrate W and at the same time most of the protective film 200 can be kept in a solid state. Since the low solubility component can be removed from the protected target surface W1 of the substrate W while kept in a solid state, the removing liquid can act on the interface between the low solubility solids 211 and the substrate W, while the particles 203 are held by the low solubility solids 211.

As a result, while the protective film 200 is quickly peeled from the substrate W, the particles 203 can be efficiently removed from the substrate W together with the protective film 200.

According to the first preferred embodiment, the substrate W can be transferred from the carrier C to the first spin chuck 6A by the transfer unit (indexer robot IR and main transfer robot CR). The substrate W is housed in the first posture in the carrier C. Therefore, the substrate W which is housed in the carrier C can be held in the first posture by the first spin chuck 6A without being turned around by the turning unit 5.

When the substrate W is turned around, the peripheral edge portion of the substrate W is brought into contact with the turning unit 5. Therefore, the substrate W is turned around in a state that the protective film 200 is coated at least at the peripheral edge portion of the protected target surface W1, which makes it possible to change the posture of the substrate W to the second posture, while preventing contamination resulting from contact with the turning unit 5.

Thereafter, in a state that the posture of the substrate W is the second posture, the cleaning target surface W2 can be cleaned from above by the scrub cleaning unit 70. Therefore, it is possible to satisfactorily clean the cleaning target surface W2, with no space limitation by the second spin base 61. Because of no space limitation by the second spin base 61, cleaning of the cleaning target surface W2 by using a unit such as the scrub cleaning unit 70 which is larger than the lower nozzle 12 can be realized.

As described above, it is possible to satisfactorily clean the cleaning target surface W2 while preventing contamination of the protected target surface W1.

According to the first preferred embodiment, the protected target surface W1 is protected by coating of the protective film 200. Therefore, unlike the first preferred embodiment, as compared with a case that the protected target surface W1 is protected by using a protective tape, it is possible to prevent an adhesive agent of the protective tape from being brought up at the time of scrub cleaning and the brought-up adhesive agent adhering to the cleaning target surface W2 of the substrate.

Where the adhesive agent adheres to the cleaning target surface W2, cracks may be formed on the substrate W due to the adhesive agent when the cleaning target surface W2 is suctioned by the first spin base 21 in order to remove the protective tape. According to the first preferred embodiment, since no adhesive agent adheres to the first spin base 21, the cracks on the substrate W can be prevented.

Where the protective tape is used, in order to prevent the cracks on the substrate W, it is necessary to prevent the adhesive agent from being brought up and also prevent the substrate from forming cracks by adjusting a cleaning position by the cleaning brush 72 at high accuracy and adjusting a suction position of the first spin base 21.

Consequently, according to the first preferred embodiment, as compared with a configuration in which the protected target surface W1 is protected by the protective tape, it is possible to protect the protected target surface W1 and also prevent cleaning of the cleaning target surface W2 from becoming complicated.

Figure 10:
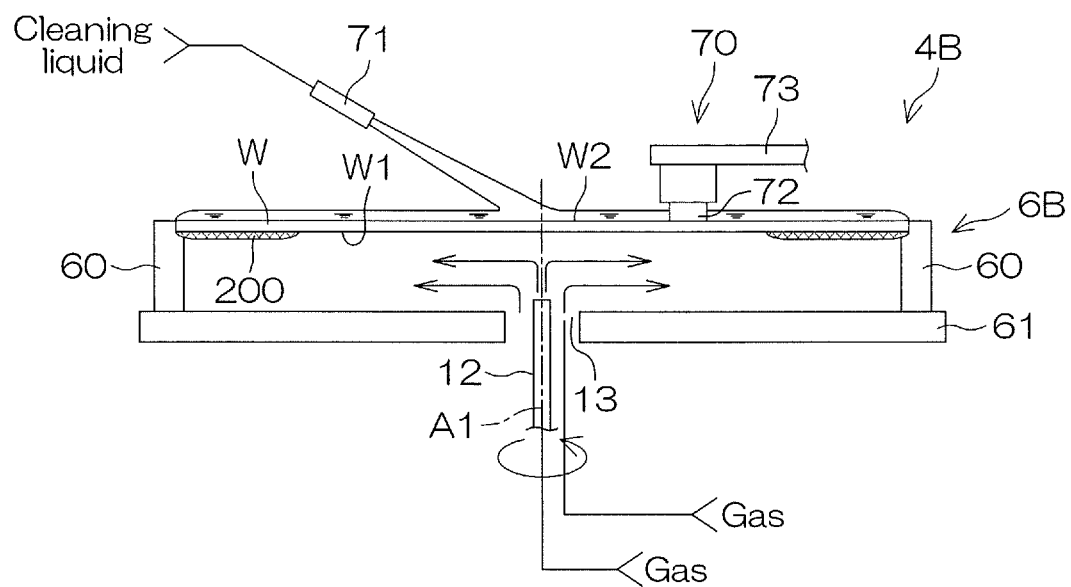
FIG. 10 is a schematic view for describing a modified example of the substrate processing according to the first preferred embodiment.

As shown in FIG. 10, the protective film 200 may be coated only at the peripheral edge portion of the protected target surface W1 of the substrate W. The plurality of chuck pins 60 of the second spin chuck 6B grip the peripheral edge portion of the substrate W to hold the substrate W in the second posture. Therefore, even in such a configuration that the protective film 200 is coated only at the peripheral edge portion of the protected target surface W1 of the substrate W, it is possible to prevent contamination of the protected target surface W1 of the substrate W due to holding by the second spin chuck 6B. Further, the turning unit 5 clamps the peripheral edge portion of the substrate W by the first facing member 91 and the second facing member 92 to turn around the substrate W. Therefore, even in such a configuration that the protective film 200 is coated only at the peripheral edge portion of the protected target surface W1 of the substrate W, it is possible to prevent contamination of the protected target surface W1 of the substrate W by the turning unit 5.

Similarly, it is possible to prevent contamination of the protected target surface W1 of the substrate W by the plurality of first supporting members 82 of the turning unit 5, the plurality of second supporting members 83, the plurality of first lower supporting members 86, and the plurality of second lower supporting members 87. Similarly, it is possible to prevent contamination of the protected target surface W1 of the substrate W by the hands H of the plurality of transfer robots. As described above, the protective film 200 may be coated at least at the peripheral edge portion of the protected target surface W1. However, as described above, the protective film 200 is coated on the entirety of the protected target surface W1, by which the protected target surface W1 can be more effectively prevented from contamination substances which are scattered during physical cleaning such as scrub cleaning.

Figure 11:
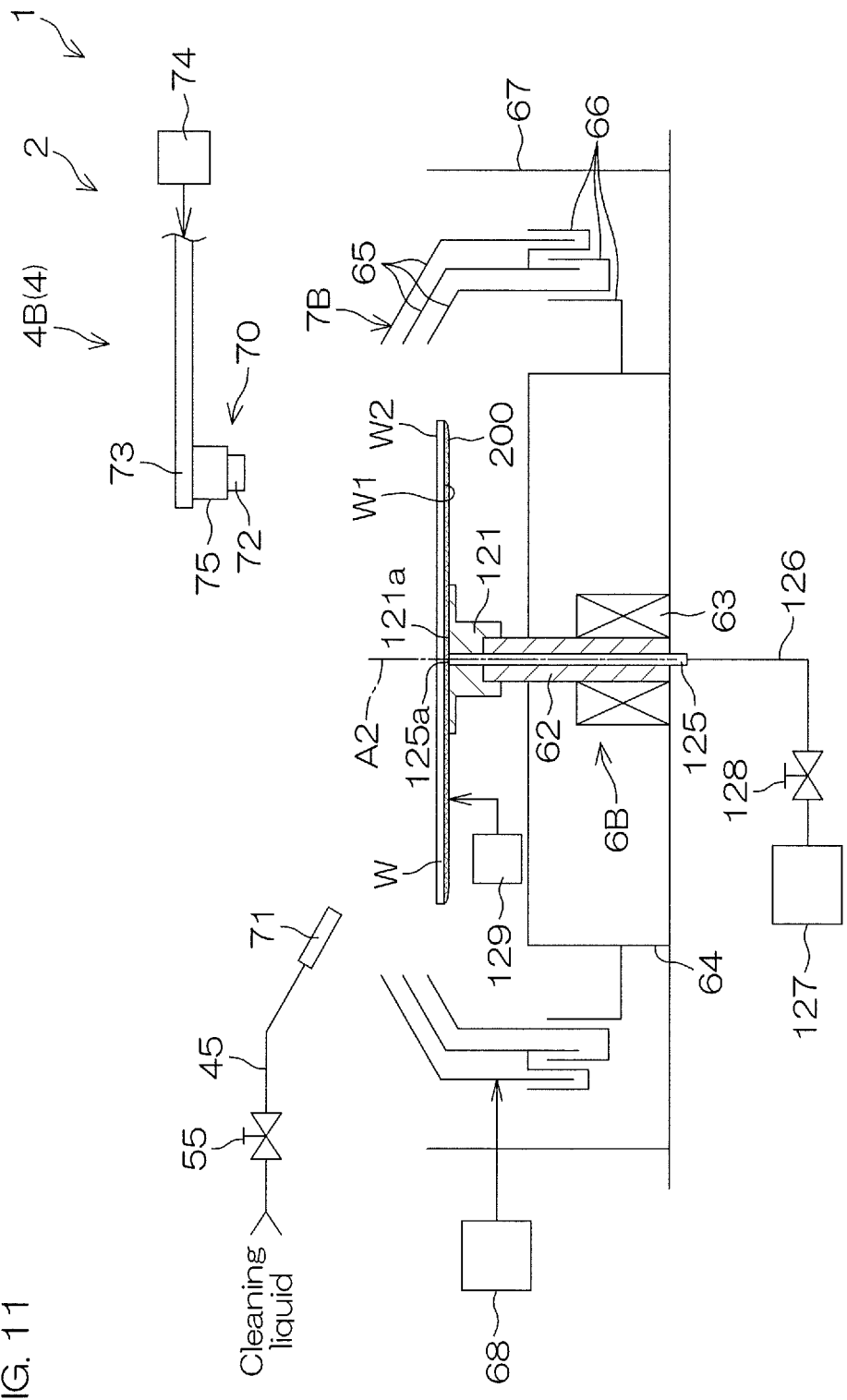
FIG. 11 is a schematic cross-sectional view for describing a configuration example of a physical cleaning device according to the modified example of the first preferred embodiment.

FIG. 11 is a schematic cross-sectional view for describing a configuration example of the physical cleaning device 4B according to a first modified example of the first preferred embodiment.

In a second spin chuck 6B of a physical cleaning device 4B according to the first modified example of the first preferred embodiment, a second spin base 121 is configured so as to face a substrate W from below and hold by suction a central portion of a cleaning target surface W2 of the substrate W.

The second spin base 121 has a suction surface 121a which suctions the cleaning target surface W2 of the substrate W. The suction surface 121a is, for example, an upper surface of the second spin base 121, that is, a circular surface where a rotational axis A2 passes through the center thereof. The suction surface 121a is smaller in diameter than the substrate W. An upper end portion of a second rotating shaft 62 protrudes from a second motor housing 64 and is joined to the second spin base 121.

A suction route 125 is inserted into the second spin base 121 and the second rotating shaft 62. A suction route 125 has a suction port 125a which is exposed from the center of the suction surface 121a of the second spin base 121. The suction route 125 is coupled to a suction piping 126. The suction piping 126 is coupled to a suction device 127 such as a vacuum pump.

A suction valve 128 for opening and closing the route is interposed in the suction route 125. The suction valve 128 is opened, by which the substrate W disposed on the suction surface 121a of the second spin base 121 is suctioned by the suction port 125a of the suction route 125. Thereby, the substrate W is suctioned by the suction surface 121a from below and held in a predetermined holding position (position of the substrate W shown in FIG. 11, second holding position). The second spin chuck 6B is an example of a second suctioning/holding unit which holds the substrate W by suction of the second spin base 121.

The second spin base 121 is rotated by the second rotating shaft 62 being rotated by a second spin motor 63. The substrate W is thereby rotated around the rotational axis A2 together with the second spin base 121.

The second spin chuck 6B may be provided with a centering unit 129 which moves the substrate W horizontally so that the center of the cleaning target surface W2 of the substrate W can move close to the rotational axis A2.

In the first modified example, a protective film 200 is coated on the entirety of the protected target surface W1 of the substrate W, and the second spin chuck 6B holds the substrate W by the second spin base 121 which suctions the central portion of the protected target surface W1. Therefore, without the second spin base 121 being directly brought into contact with the central portion of the protected target surface W1 of the substrate W, the central portion of the protective film 200 can be suctioned by the second spin base 121 to hold the substrate W. Therefore, it is possible to prevent contamination of the protected target surface W1 resulting from the substrate W which is held at the time of physical cleaning.

Second Preferred Embodiment

Figure 12:
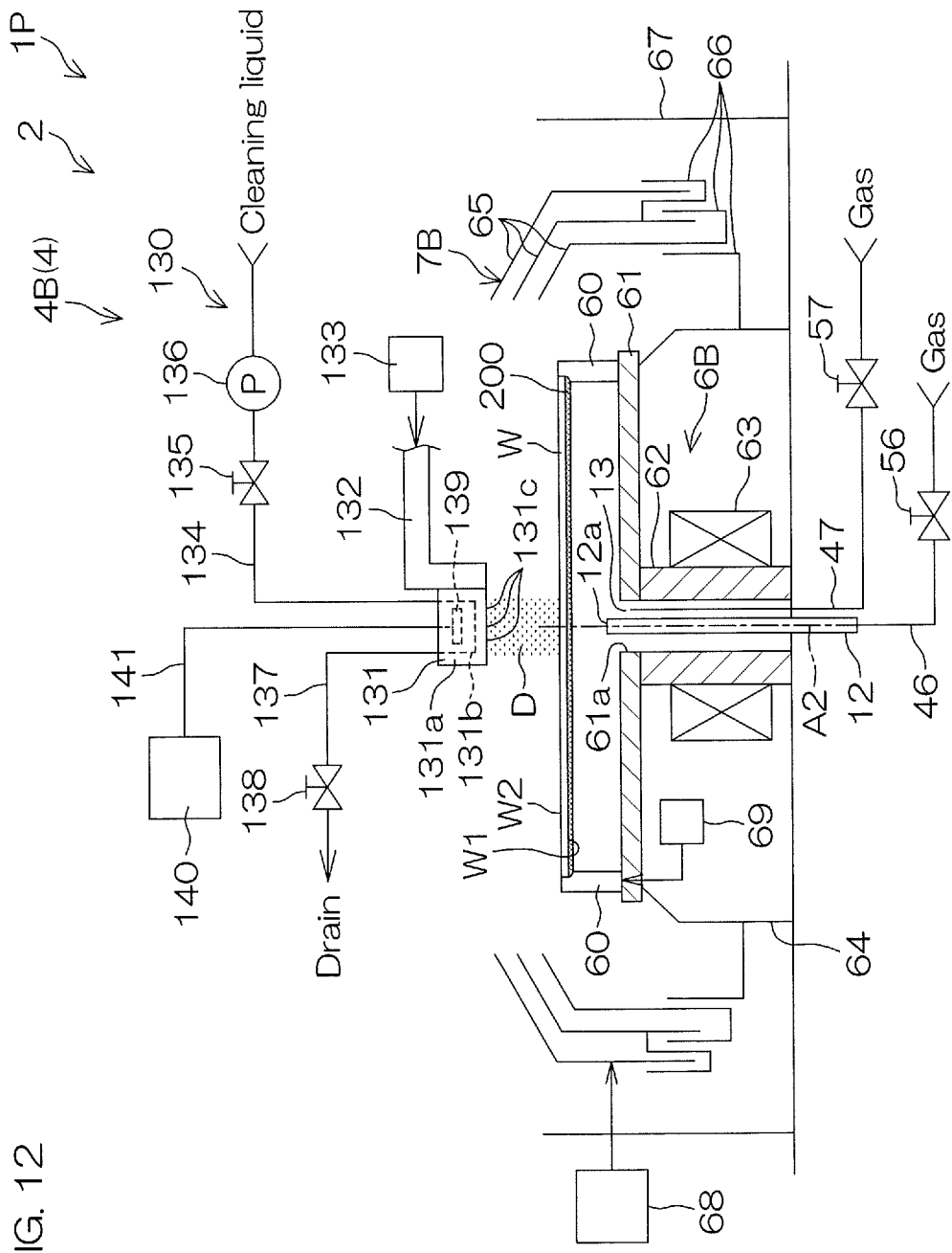
FIG. 12 is a schematic cross-sectional view of a physical cleaning device provided in a substrate processing system according to a second preferred embodiment of the present invention.

FIG. 12 is a schematic cross-sectional view for describing a configuration example of a physical cleaning device 4B provided in a substrate processing system 1P according to the second preferred embodiment. In FIG. 12, a configuration in common with the configurations shown in FIG. 1 to FIG. 11 shall be provided with the same reference symbols as those of FIG. 1, etc., and a description thereof shall be omitted.

The substrate processing system 1P is different from the substrate processing system 1 of the first preferred embodiment mainly in that the physical cleaning device 4B according to the second preferred embodiment includes a spray cleaning unit 130 (cleaning unit) which executes spray cleaning (physical clean) on a cleaning target surface W2 of a substrate W in place of the scrub cleaning unit 70. The spray cleaning is a cleaning method in which a cleaning liquid in a droplet state is made to collide with the cleaning target surface W2, thereby causing a physical force to act on the cleaning target surface W2. The physical force of the spray cleaning is an impact (kinetic energy) when droplets D of the cleaning liquid collide with the cleaning target surface W2.

The spray cleaning unit 130 includes a spray nozzle 131 which sprays a large number of droplets of the cleaning liquid (for example, DIW), a swinging arm 132 which holds the spray nozzle 131 at a leading end portion thereof, and an arm driving mechanism 133 which swings the swinging arm 132.

The arm driving mechanism 133 is configured so as to be able to swing the swinging arm 132 along a horizontal plane and move the swinging arm 132 up and down. The arm driving mechanism 133 includes, for example, a raising/lowering actuator (not shown) which moves the swinging arm 132 up and down and a swinging actuator (not shown) which swings the swinging arm 132. The raising/lowering actuator may be an electric motor or an air cylinder. The swinging actuator may be an electric motor or an air cylinder.

The spray cleaning unit 130 includes a cleaning liquid piping 134 which guides the cleaning liquid from a supply source of the cleaning liquid to the spray nozzle 131, a cleaning liquid valve 135 which opens and closes a flow route inside the cleaning liquid piping 134, a pump 136 which sends the liquid to the cleaning liquid piping 134, a discharging piping 137 which discharges the cleaning liquid inside the spray nozzle 131 and a discharging valve 138 which opens and closes a flow route inside the discharging piping 137.

The cleaning liquid is constantly supplied to the spray nozzle 131 at a predetermined pressure (for example, not more than 10 MPa). The pump 136 can change a pressure of the cleaning liquid supplied to the spray nozzle 131 to any given pressure.

The spray cleaning unit 130 includes a piezoelectric element 139 which is housed internally in the spray nozzle 131. A voltage application unit 140 is connected via a wiring 141 to the piezoelectric element 139. An alternating-current (AC) voltage is applied to the piezoelectric element 139, and the voltage application unit 140 vibrates the piezoelectric element 139 at a frequency corresponding to a frequency of the applied AC voltage. The voltage application unit 140 includes, for example, an inverter. The voltage application unit 140 can convert a frequency of the AC voltage applied to the piezoelectric element 139 to any given frequency (for example, several hundred KHz to several MHz).

The spray nozzle 131 has a nozzle main body 131a, a cleaning liquid flow channel 131b which is formed inside the nozzle main body 131a and a plurality of spray ports 131c (discharge ports) which are connected to the cleaning liquid flow channel 131b and opened from a front surface of the nozzle main body 131a. The cleaning liquid flow channel 131b is a flow route through which the cleaning liquid is supplied from the cleaning liquid piping 134 and the cleaning liquid is discharged to the discharging piping 137.

The cleaning liquid is constantly supplied at a high pressure to the spray nozzle 131. Ina state that the discharging valve 138 is closed, the cleaning liquid in the cleaning liquid flow channel 131b is high in pressure (liquid pressure). Therefore, in a state that the discharging valve 138 is closed, the cleaning liquid is sprayed by the liquid pressure from each of the spray ports 131c. Further, in a state that the discharging valve 138 is closed, an AC voltage is applied to the piezoelectric element 139, by which vibration of the piezoelectric element 139 is imparted to the cleaning liquid which flows through the cleaning liquid flow channel 131b, and the cleaning liquid sprayed from each of the spray ports 131c is interrupted by the vibration. Therefore, in a state that the discharging valve 138 is closed, an AC voltage is applied to the piezoelectric element 139, by which the cleaning liquid in a droplet state is sprayed from each of the spray ports 131c. Thereby, a large number of droplets D of the cleaning liquid uniform in particle size are sprayed at a constant speed and at the same time.

The cleaning liquid which is discharged from the spray nozzle 131 is not limited to DIW. The cleaning liquid discharged from the spray nozzle 131 can be selected from liquids mentioned as the rinse liquid used in the film coating/removing device 4A.

According to the second preferred embodiment, the substrate processing shown in FIG. 7 can be executed by the substrate processing system 1P. However, in the physical cleaning step (Step S4), the spray cleaning unit 130 cleans the cleaning target surface W2 of the substrate W in a state that a protective film 200 is formed on the protected target surface W1 and also the substrate W is held by the second spin chuck 6B. In detail, spray cleaning (physical cleaning) is executed in which a large number of droplets D of the cleaning liquid are sprayed on the cleaning target surface W2 of the substrate W, by which a physical force can act on the cleaning target surface W2 to clean the cleaning target surface W2.

Specifically, the cleaning liquid valve 135 is opened, the discharging valve 138 is closed, and the voltage application unit 140 applies an AC voltage to the piezoelectric element 139. Thereby, the cleaning liquid is supplied (discharged) in a droplet state from the spray nozzle 131 toward the central region of the upper surface of the substrate W in a rotating state (droplet supplying step). At this time, the arm driving mechanism 133 moves the swinging arm 132 in a radius direction of the substrate W, which makes it possible to spray-clean the entirety of the cleaning target surface W2 of the substrate W.

According to the second preferred embodiment, the spray cleaning unit 130 includes the spray nozzle 131 which sprays droplets D of the cleaning liquid to the cleaning target surface W2, thereby spray-cleaning the cleaning target surface W2. The spray cleaning imparts an impact energy larger than that of the cleaning by a liquid in a continuous flow to the cleaning target surface W2. Therefore, the contamination substances can be easily scattered, as compared with the cleaning by the cleaning liquid in the continuous flow.

Like the second preferred embodiment, where the protective film 200 is coated on the entirety of the protected target surface W1, while the cleaning target surface W2 is sufficiently cleaned by the physical cleaning, contamination of the protected target surface W1 resulting from physical cleaning can be prevented.

For example, where DIW is used as the cleaning liquid and ammonia water is used as the removing liquid, the solubility of the protective film 200 to the cleaning liquid is lower than the solubility of the protective film 200 to the removing liquid. Where the cleaning liquid adhered to the cleaning target surface W2 flows along the peripheral edge portion of the substrate W and moves to the protected target surface W1 or even where the cleaning liquid collided with the cleaning target surface W2 splashes back from the cleaning target surface W2, floats around the substrate W and adheres to the protected target surface W1, it is possible to prevent an unintended dissolution of the protective film 200 resulting from the cleaning liquid.

Third Preferred Embodiment

Figure 13A:
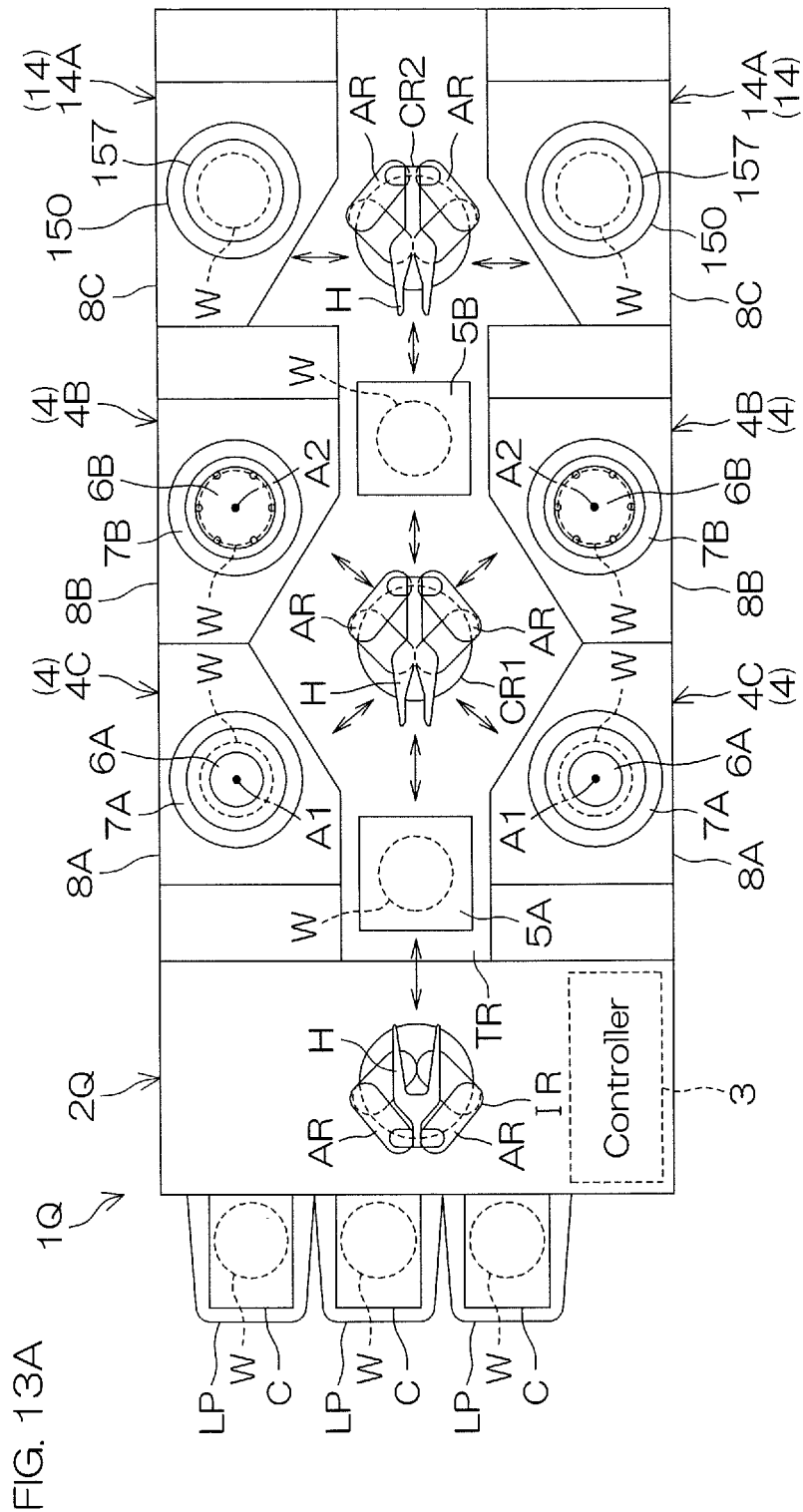
FIG. 13A is a plan view for describing a configuration of a substrate processing system according to a third preferred embodiment of the present invention.
Figure 13B:
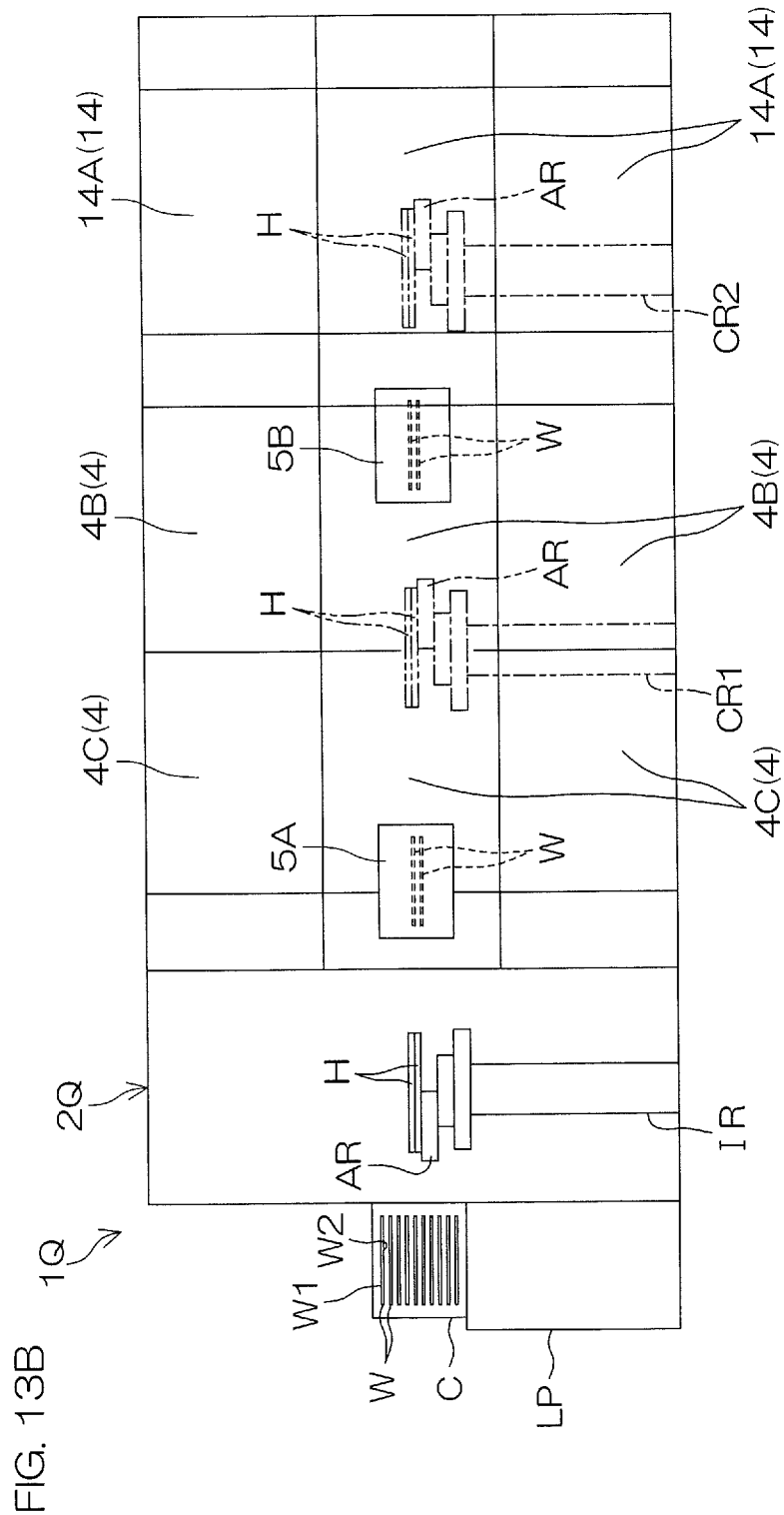
FIG. 13B is an illustrative elevation view for describing a configuration of a substrate processing apparatus according to the third preferred embodiment.

FIG. 13A is a plan view for describing a configuration of a substrate processing apparatus 2Q provided in a substrate processing system 1Q according to the third preferred embodiment of the present invention. FIG. 13B is an illustrative elevation view for describing the configuration of the substrate processing apparatus 2Q according to the third preferred embodiment. In FIG. 13A and FIG. 13B as well as FIG. 14 to FIG. 17 which will be described later, a configuration in common with the configurations shown in FIG. 1 to FIG. 12 which have been described previously shall be provided with the same reference symbols as those of FIG. 1, etc., and a description thereof shall be omitted.

Unlike the substrate processing apparatus 2 (refer to FIG. 1A) according to the first preferred embodiment, the substrate processing apparatus 2Q is configured so as to be able to remove a protective film from a protected target surface W1 by dry processing. In detail, the substrate processing apparatus 2Q includes a plurality of liquid processing devices 4, a plurality of transfer robots, a turning unit 5A (first turning unit), a turning unit 5B (second turning unit), and a plurality of dry processing devices 14 which execute dry processing on a substrate W.

In the third preferred embodiment, the plurality of transfer robots include an indexer robot IR which carries the substrate W in and carries it out from a carrier C on a load port LP, a first main transfer robot CR1 which receives and delivers the substrate W from and to the indexer robot IR and also carries the substrate W in and carries it out from the plurality of liquid processing devices 4, and a second main transfer robot CR2 which receives and delivers the substrate W from and to the first main transfer robot CR1 and also carries the substrate W in and carries it out from the plurality of dry processing devices 14.

The turning unit 5A receives the substrate W from the indexer robot IR and the first main transfer robot CR1 and turns around the substrate W so that a posture of the substrate W can be changed to one of a first posture and a second posture. The turning unit 5B receives the substrate W from the first main transfer robot CR1 and the second main transfer robot CR2 and turns around the substrate W so that the posture of the substrate W can be changed to one of the first posture and second posture. The configuration and the operation of the turning unit 5A and the turning unit 5B are the same as those of the turning unit 5 shown in FIG. 5A to FIG. 5D.

The indexer robot IR, the first main transfer robot CR1, and the second main transfer robot CR2 are disposed on a transfer route TR. The turning unit 5A is on the transfer route TR positioned between the indexer robot IR and the first main transfer robot CR1. The turning unit 5B is on the transfer route TR positioned between the first main transfer robot CR1 and the second main transfer robot CR2.

Each of the transfer robots is an articulated arm robot which includes a pair of articulated arms AR and a pair of hands H which are each provided at the leading ends of the pair of articulated arms AR so as to be separated up and down from each other. The hands H provided on each of the transfer robots are configured so as to be brought into contact with a peripheral edge portion of the cleaning target surface W2 or the protected target surface W1 which is facing downward, thereby holding the substrate W.

The plurality of liquid processing devices 4 include a plurality of film coating devices 4C which coat the protective film on the protected target surface W1 of the substrate W and a plurality of physical cleaning devices 4B which execute physical cleaning on the cleaning target surface W2 of the substrate W. The plurality of dry processing devices 14 include a plurality of film removing devices 14A which remove the protective film from the protected target surface W1 of the substrate W.

The plurality of liquid processing devices 4 constitute four liquid processing towers disposed respectively in four positions which are separated horizontally. Each of the liquid processing towers includes the plurality of liquid processing devices 4 (three in the example of FIG. 13B) which are stacked in an up/down direction. The four liquid processing towers are disposed so that two of them are each on both sides of the transfer route TR. The plurality of dry processing devices 14 constitute two dry processing towers which are disposed further on the opposite side of the indexer robot IR side than the four liquid processing towers. The two dry processing towers are disposed so that one of them is each on both sides of the transfer route TR.

In this preferred embodiment, the two processing towers on the indexer robot IR side are constituted of the plurality of film coating devices 4C, and the two processing towers on the opposite side of the indexer robot IR are constituted of the plurality (three in the sample of FIG. 13B) of the physical cleaning devices 4B. The two dry processing towers are constituted of the plurality of film removing devices 14A.

Figure 14:
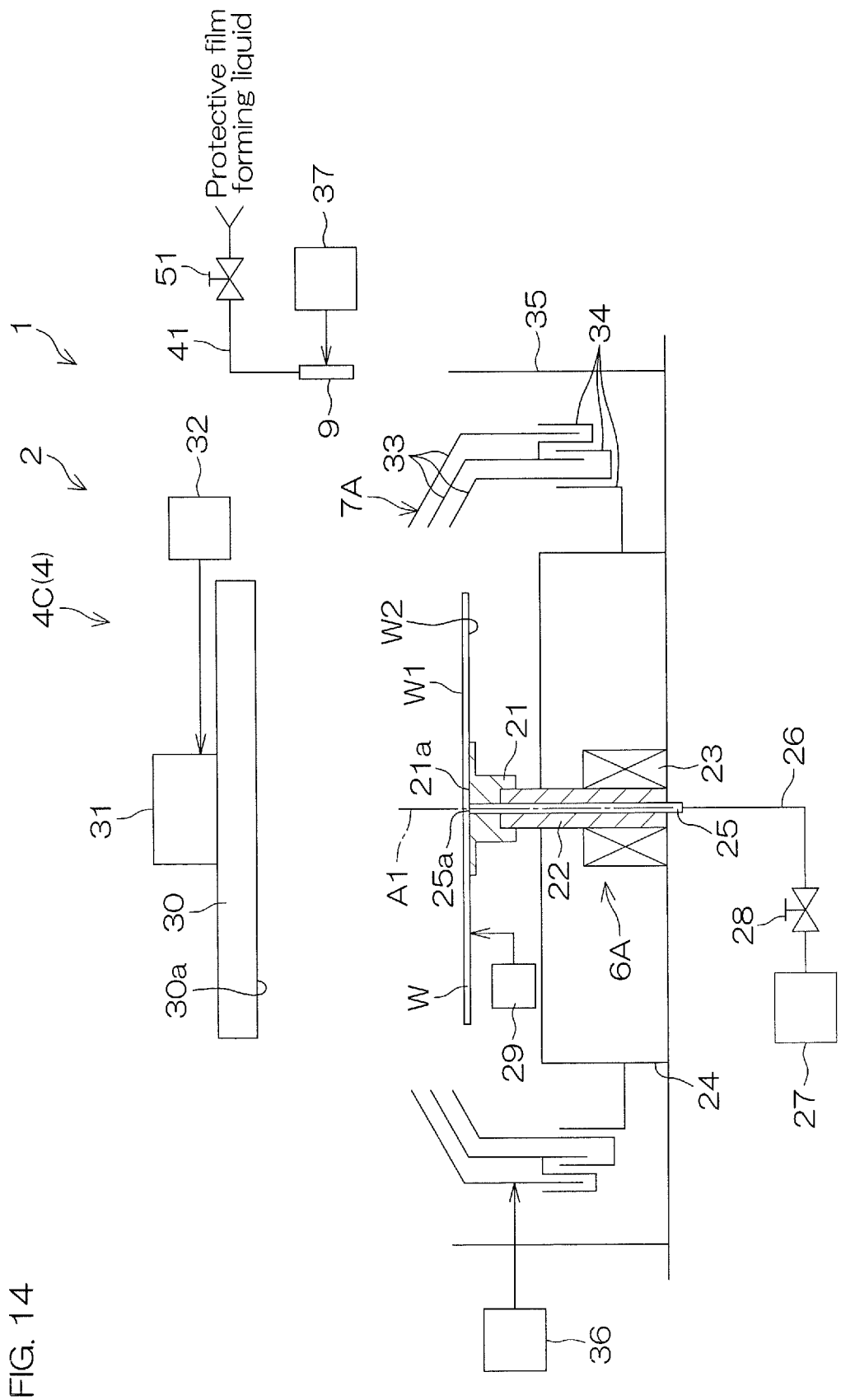
FIG. 14 is a schematic cross-sectional view of a film coating device of the substrate processing apparatus provided in the substrate processing system according to the third preferred embodiment.

As shown in FIG. 14, the film coating device 4C has the same configuration as that of the film coating/removing device 4A (refer to FIG. 3) according to the first preferred embodiment, except for the moving nozzle 9. In detail, the moving nozzle 9 provided in the film coating device 4C is directly connected to a protective film forming liquid piping 41, and the moving nozzle 9 is configured so as not to discharge a removing liquid. Further, units for supplying a rinse liquid and a residue removing liquid, that is, a fixed nozzle 10 and a central nozzle 11, are not disposed in the film coating device 4C.

As shown in FIG. 13A, each of the film removing devices 14A includes a third chamber 8C which houses a processing container 150 made of a metal such as aluminum or stainless steel, the surface of which is subjected to, for example, anodic oxidation (alumite treatment). As with the first chamber 8A, the third chamber 8C has an inlet/outlet (not shown) and a shutter unit (not shown).

The plurality of transfer robots (indexer robot IR, first main transfer robot CR1, and second main transfer robot CR2) constitute a transfer unit which transfers the substrate W between the plurality of carriers C (the plurality of load ports LP), the turning unit 5, the first spin chuck 6A, the second spin chuck 6B, and the processing container 150.

Figure 15:
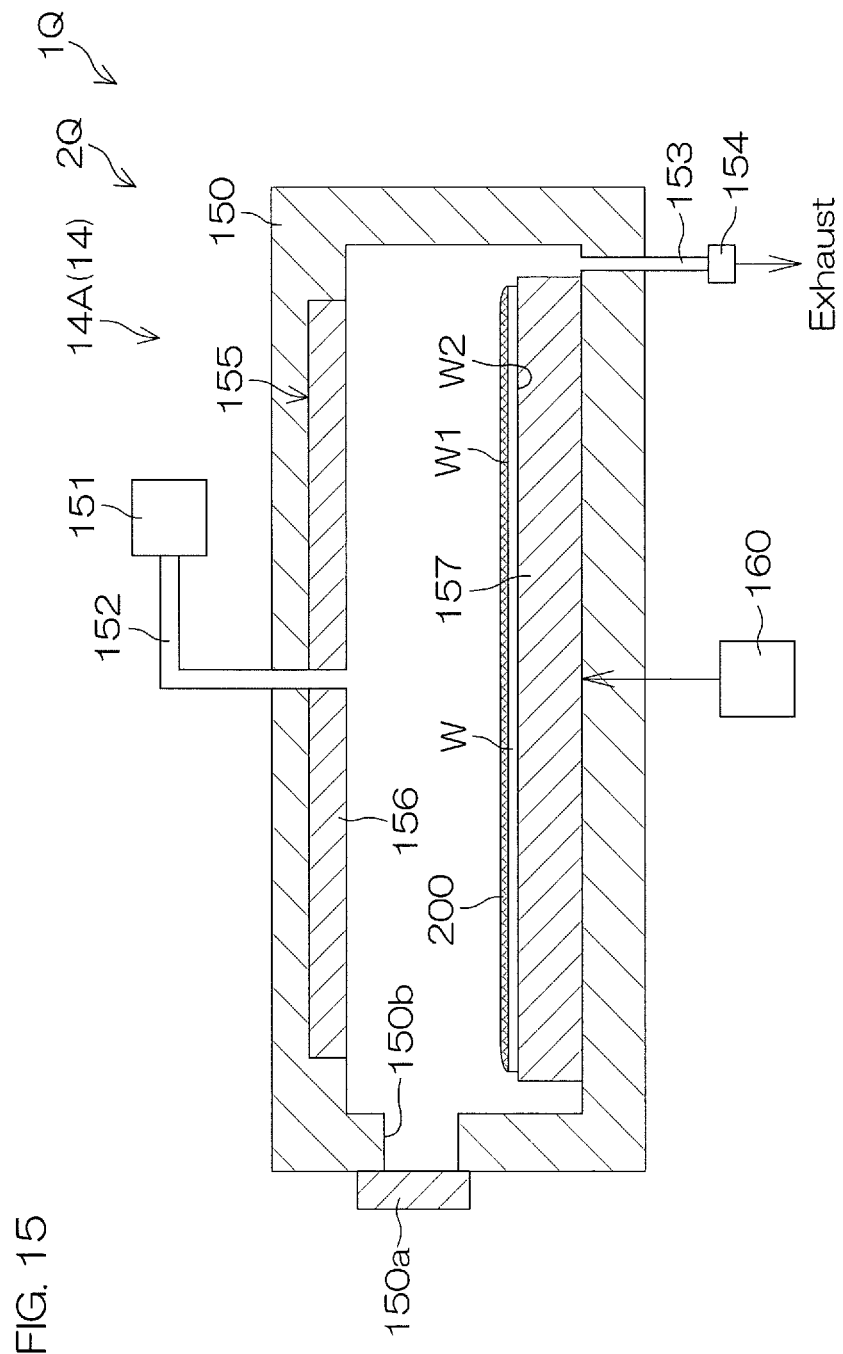
FIG. 15 is a schematic cross-sectional view for describing a configuration example of a film removing device provided in the substrate processing apparatus according to the third preferred embodiment.

FIG. 15 is a schematic cross-sectional view of the film removing device 14A. The film removing device 14A further includes a processing container 150, a processing gas piping 152 which guides a processing gas into the processing container 150 from a processing gas supplying portion 151, an exhaust piping 153 which eliminates an atmosphere inside the processing container 150, a pressure adjusting valve 154 which is interposed in the exhaust piping 153 and adjusts a pressure inside the processing container 150 and a plasma generating unit 155 (drying/removing unit) which changes the processing gas inside the processing container 150 to plasma. The plasma generating unit 155 includes an upper electrode 156 which is disposed above the substrate W and a lower electrode 157 (third base) which is disposed so as to face the upper electrode 156 and on which the substrate W is placed.

A power supplying device 160 is electrically connected to the lower electrode 157. The power supplying device 160 supplies a high frequency power (high frequency power for plasma excitation) to the lower electrode 157. The power supplying device 160 includes a filter, a matching box, a power supply, etc. An outlet 150a for carrying in the substrate W is disposed on a side wall of the processing container 150, and the processing container 150 has a gate valve 150b for opening and closing the outlet 150a. The substrate W is placed on the lower electrode 157 and thereby held horizontally in a predetermined holding position (position of the substrate W shown in FIG. 15, third holding position).

Although not shown, a plurality of lift pins for lifting up the substrate W from the lower electrode 157 may be provided. The plurality of lift pins can move between a retreat position at which a leading end portion thereof is positioned lower than an upper surface of the lower electrode 157 and a lift-up position at which the leading end portion thereof is positioned higher than the upper surface of the lower electrode 157.

The processing gas supplying portion 151 is constituted of, for example, a gas supplying source which supplies a processing gas and a purge gas necessary for the process processing of the substrate inside the processing container 150 and the cleaning processing inside the processing container 150 as well as a valve and a mass flow controller for controlling introduction of the gas from the gas supplying source.

The plasma generating unit 155 can change a processing gas inside the processing container 150 into plasma and evaporate the protective film on the substrate W without passing through a liquid state by chemical reactions such as decomposition and oxidation by oxygen radicals, etc. The processing gas is, for example, an ashing gas. The ashing gas is a gas which contains at least one type of oxygen gas ($O_2$ gas) and carbon dioxide ($CO_2$ gas).

Figure 16:
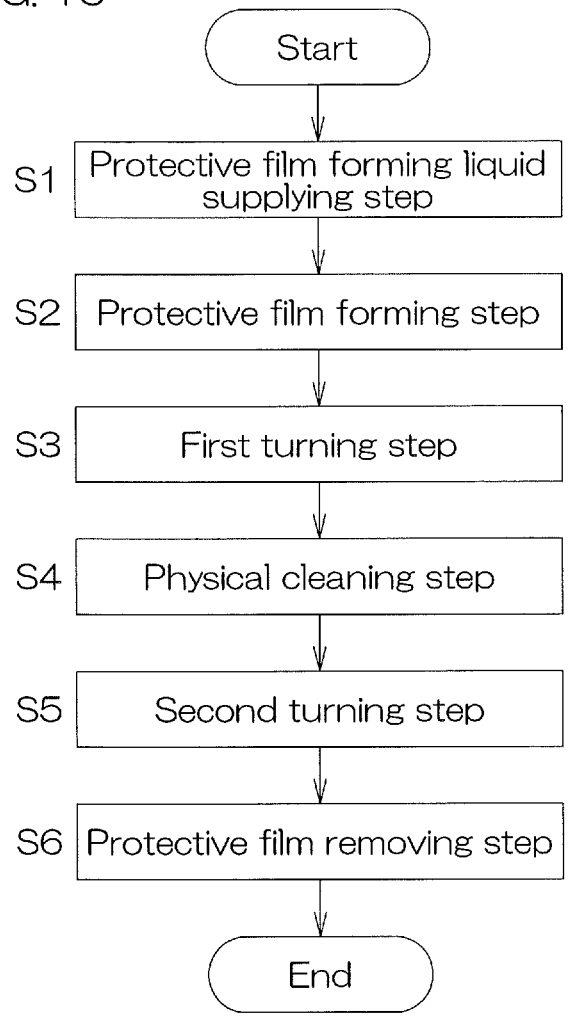
FIG. 16 is a flowchart for describing a flow of specific substrate processing by the substrate processing system according to the third preferred embodiment.

FIG. 16 is a flowchart for describing a flow of specific substrate processing by the substrate processing system 1Q according to the third preferred embodiment. In the substrate processing by the substrate processing system 1Q according to the third preferred embodiment, unlike the substrate processing shown in FIG. 7, the rinsing step (Step S7), the residue removing step (Step S8), and the drying step (Step S9) are omitted. Hereinafter, with an emphasis placed on a difference from the substrate processing according to the first preferred embodiment, a description will be given of an example of the substrate processing by the substrate processing system 1Q according to the third preferred embodiment.

In detail, first, an unprocessed substrate W is carried out from the carrier C by the indexer robot IR. The indexer robot IR delivers the substrate W via the turning unit 5A to the first main transfer robot CR1. The first main transfer robot CR1 transfers the substrate W received from the indexer robot IR into the film coating device 4C and delivers it to the first spin chuck 6A.

The substrate W is housed in the first posture in the carrier C (refer to FIG. 13B). Therefore, even after delivery to the first spin chuck 6A, the posture of the substrate W is kept in the first posture. Then, like the substrate processing according to the first preferred embodiment, the protective film 200 is coated on the protected target surface W1 of the substrate W by the film coating device 4C (refer to FIG. 8A to FIG. 8C). In other words, a protective film forming liquid supplying step (Step S1) and a protective film forming step (Step S2) are executed by the film coating device 4C.

In a state that the protective film 200 is formed on the protected target surface W1, the substrate W is carried out from the film coating device 4C by the first main transfer robot CR1. The substrate W is transferred by the first main transfer robot CR1 in a state that the hand H is in contact with the peripheral edge portion of the cleaning target surface W2. The substrate W carried out from the film coating device 4C is carried into the turning unit 5A by the first main transfer robot CR1. The substrate W carried into the turning unit 5A is turned around by the turning unit 5A so that the posture of the substrate W can be changed from the first posture to the second posture (Step S3: first turning step). In detail, the turning unit 5A turns around the substrate W while in contact with the peripheral edge portion of the substrate W so that the posture of the substrate W in a state that the protective film 200 is formed on the protected target surface W1 can be changed from the first posture to the second posture.

The substrate W which has been turned around by the turning unit 5A is carried out from the turning unit 5A by the first main transfer robot CR1. The substrate W is transferred by the first main transfer robot CR1 in a state that the hand H is in contact with the peripheral edge portion of the protected target surface W1. The substrate W is carried into the physical cleaning device 4B by the first main transfer robot CR1 and delivered to the second spin chuck 6B. Then, like the substrate processing according to the second preferred embodiment, the cleaning target surface W2 of the substrate W is physically cleaned by the physical cleaning device 4B (physical cleaning step: Step S4).

After the physical cleaning step (Step S4), the substrate W is carried out from the physical cleaning device 4B by the first main transfer robot CR1 and, thereafter, carried into the turning unit 5B. The substrate W carried into the turning unit 5B is turned around by the turning unit 5B so that the posture of the substrate W can be changed to the first posture (Step S5: second turning step). In detail, the turning unit 5B turns around the substrate W while in contact with the peripheral edge portion of the substrate W so that the posture of the substrate W in a state that the protective film 200 is formed on the protected target surface W1 can be changed from the second posture to the first posture.

The substrate W which has been turned around by the turning unit 5B is carried out from turning unit 5B by the second main transfer robot CR2. The substrate W is transferred by the second main transfer robot CR2 in a state that the hand H is in contact with the peripheral edge portion of the cleaning target surface W2. Then, the substrate W is carried into the film removing device 14A by the second main transfer robot CR2 and delivered to the plasma generating unit 155. In detail, the substrate W is placed on the lower electrode 157. Thereby, as shown in FIG. 15, the substrate W is held in the first posture in the third holding position (third substrate holding step). As described above, the lower electrode 157 holds the substrate in a state that the posture thereof is changed by the turning unit 5B from the second posture to the first posture. The lower electrode 157 is an example of the third substrate holding unit.

Then, while an ashing gas is introduced from the processing gas supplying portion 151 into the processing container 150, the pressure adjusting valve 154 is adjusted for an aperture so that a pressure inside the processing container 150 becomes an ashing pressure set in advance (ashing gas introducing step). Next, a high frequency is applied from the power supplying device 160. A high frequency of, for example, 40 MHz, is applied at a power of 1000 W. Thereby, plasma of an oxygen gas is excited and the protective film 200 is changed into a gas without passing through a liquid state by chemical reactions resulting from plasma inside the processing container 150. Thereby, the protective film 200 is removed from the substrate W (protective film evaporating/removing step). After a predetermined period of time has elapsed from the start of application of the high frequency, the high frequency from the power supplying device 160 is stopped and introduction of the oxygen gas is stopped.

As described above, the plasma generating unit 155 executes plasma processing on the protected target surface W1 of the substrate W in a state that the protective film 200 is formed on the protected target surface W1 and that is also held by the lower electrode 157, thereby removing the protective film 200 from the protected target surface W1.

Thereafter, the second main transfer robot CR2 enters into the film removing device 14A, receives the processed substrate W from the lower electrode 157 and carries it out of the film removing device 14A. The substrate W carried out from the film removing device 14A is delivered from the second main transfer robot CR2 to the indexer robot IR sequentially via the turning unit 5B, the first main transfer robot CR1, and the turning unit 5A. The indexer robot IR houses the substrate W into the carrier C, with the posture of the substrate W kept in the first posture (refer to FIG. 13B as well).

Figure 17:
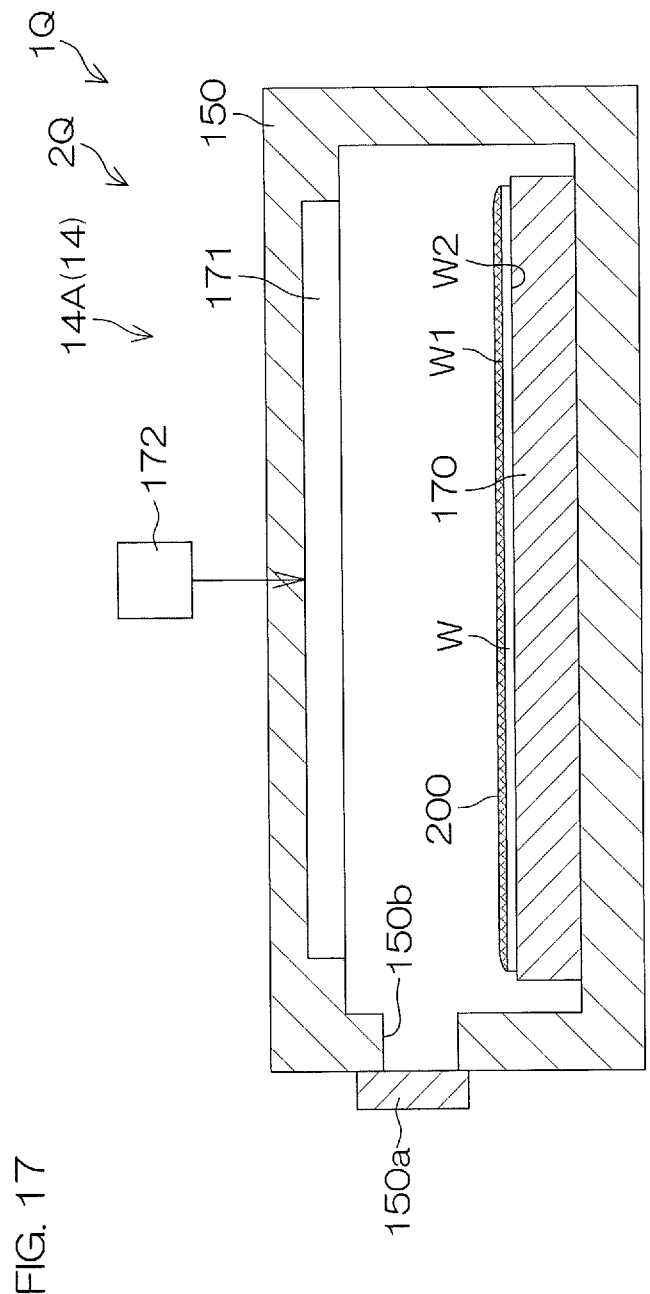
FIG. 17 is a schematic cross-sectional view for describing a modified example of the film removing device provided in the substrate processing apparatus according to the third preferred embodiment.

Further, unlike the example shown in FIG. 15, there may be such a configuration that the protective film 200 is removed by light irradiation. For example, as shown in FIG. 17, the film removing device 14A may include a processing container 150, a base 170 (third base) which is disposed inside the processing container 150 and in which the substrate W is placed, and a light irradiation unit 171 (drying/removing unit) which irradiates light such as UV toward the protected target surface W1 of the substrate W which is placed in the base 170. In this case, the protective film 200 on the substrate W is decomposed by irradiation and changed into a gas without passing through a liquid state. The light irradiation unit 171 includes, for example, a plurality of light irradiation lamps. A power supplying device 172 which supplies power to the light irradiation lamps is connected to the light irradiation unit 171.

Where the light irradiation unit 171 is used for removal of the protective film 200, the substrate W carried into the film removing device 14A is placed in the base 170 and, as shown in FIG. 17, held in the first posture in the third holding position (third substrate holding step). The base 170 is an example of the third substrate holding unit.

Then, power is supplied from the power supplying device 172, and the light irradiation unit 171 irradiates light such as UV (light irradiation step). The protective film 200 is changed into a gas by light irradiation without passing through a liquid state and thereby removed from the substrate W (protective film evaporating/removing step).

As described above, the light irradiation unit 171 executes light irradiation processing on the protected target surface W1 of the substrate W in a state that the protective film 200 is formed on the protected target surface W1 and that is also held by the base 170, thereby removing the protective film 200 from the protected target surface W1.

As described above, the film removing device 14A executes the plasma processing or the light irradiation processing on the protected target surface W1 of the substrate W, which makes it possible to remove the protective film 200 from the protected target surface W1 of the substrate W, with no liquid supplied to the substrate W. Therefore, it is possible to save time and labor for drying the substrate W and also prevent occurrence of watermarks (dry marks) when drying the protected target surface W1.

<One Example of Protective Film Forming Liquids>

Hereinafter, a description will be given of one example of individual components in the protective film forming liquids used in the aforementioned preferred embodiments.

Hereinafter, expressions of "$C_{x\text{-}y}$," "$C_x\text{-}C_y$," and "$C_x$" mean the number of carbons in a molecule or a substituent. For example, $C_{1\text{-}6}$ alkyl means an alkyl chain (methyl, ethyl, propyl, butyl, pentyl, hexyl, etc.) having carbon atoms of not less than 1 and not more than 6.

Where a polymer has plural types of repeating units, these repeating units undergo copolymerization. Unless otherwise specified, the copolymerization may be alternating copolymerization, random copolymerization, block copolymerization, graft copolymerization, or a mixture of them. Where a polymer and a resin are indicated by a structural formula, n, m, etc., written in parentheses indicate the repeating number.

<Low Solubility Component>

(A) The low solubility component contains at least one of novolak, polyhydroxystyrene, polystyrene, a polyacrylic acid derivative, a polymaleic acid derivative, polycarbonate, a polyvinyl alcohol derivative, a polymethacrylic acid derivative, and a copolymer of their combination. Preferably, (A) the low solubility component may contain at least one of novolak, polyhydroxystyrene, a polyacrylic acid derivative, polycarbonate, a polymethacrylic acid derivative, and a copolymer of their combination. More preferably, (A) the low solubility component may contain at least one of novolak, polyhydroxystyrene, polycarbonate, and a copolymer of their combination. Novolak may be phenol novolak.

The protective film forming liquid may contain a combination of one or two of the aforementioned favorable examples as (A) the low solubility component. For example, (A) the low solubility component may contain both of novolak and polyhydroxystyrene.

Such a mode is preferable that (A) the low solubility component is made into a film by drying and the film is not substantially dissolved by a removing liquid but is peeled, with objects to be removed being kept. It is noted that such a mode is permissible that only a small part of (A) the low solubility component is dissolved by the removing liquid.

Preferably, (A) the low solubility component does not contain fluorine and/or silicon and more preferably contains none of them.

The aforementioned copolymerization is preferably random copolymerization or block copolymerization.

With no intention to limit the scope of claims, specific examples of (A) the low solubility component include the following compounds indicated by Chemical Formula 1 to Chemical Formula 7 given below.

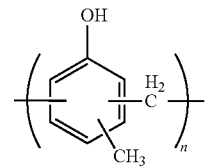

[Chemical Formula 1]

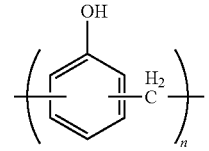

[Chemical Formula 2]

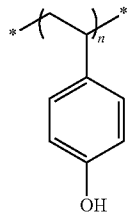

[Chemical Formula 3]

(Asterisk * indicates a bonding to an adjacent constituent unit)

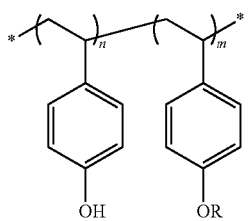

[Chemical Formula 4]

(R represents a substituent such as $C_{1-4}$ alkyl. Asterisk * indicates a bonding to an adjacent constituent unit)

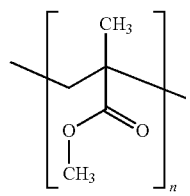

[Chemical Formula 5]

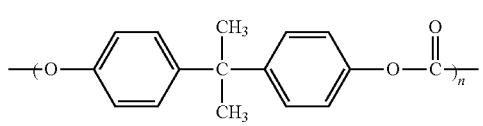

[Chemical Formula 6]

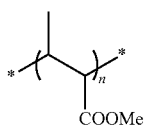

[Chemical Formula 7]

(Me represents a methyl group. Asterisk * indicates a bonding to an adjacent constituent unit.)

A weight average molecular weight (Mw) of (A) the low solubility component is preferably 150 to 500,000, more preferably 300 to 300,000 and further more preferably 500 to 100,000, and still further more preferably 1,000 to 50,000.

(A) The low solubility components can be obtained by synthesis. These can also be purchased. Where the low solubility components are purchased, these are available from the following suppliers. The suppliers are also able to synthesize (A) polymers.
Novolak: Showa Chemical Industry, Co., Ltd., Asahi Yukizai Corporation, Gun Ei Chemical Industry Co., Ltd., Sumitomo Bakelite Co., Ltd.
Polyhydroxystyrene: Nippon Soda Co., Ltd., Maruzen Petrochemical Co., Ltd., Toho Chemical industry Co., Ltd.
Polyacrylic acid derivatives: Nippon Shokubai Co., Ltd.
Polycarbonate: Sigma-Aldrich
Polymethacrylic acid derivatives: Sigma-Aldrich As compared with a total mass of the protective film forming liquid, (A) the low solubility component is 0.1 to 50 mass %, preferably 0.5 to 30 mass %, more preferably 1 to 20 mass %, and furthermore preferably 1 to 10 mass %. That is, where the total mass of the protective film forming liquid is given as 100 mass % and used as a reference, (A) the low solubility component is 0.1 to 50 mass %. That is, "as compared with" can be read as "as a reference." Unless otherwise specified, the same shall apply to the following.

<High Solubility Component>
(B) The high solubility component is (B') a crack promoting component. (B') The crack promoting component contains hydrocarbon and also contains a hydroxy group (—OH) and/or a carbonyl group (—C(=O)—). Where (B') the crack promoting component is a polymer, one type of constituent unit contains a hydrocarbon for each unit and also has a hydroxy group and/or a carbonyl group. The carbonyl group includes carboxylic acid (—COOH), aldehyde, ketone, ester, amide, and enone, and carboxylic acid is preferable.

With no intention to limit the scope of claims or without being constrained by theory, when a protective film forming liquid is dried to form a protective film on a substrate and a removing liquid peels the protective film, (B) the high solubility component is thought to yield a portion which gives a chance to peel the protective film. Therefore, preferably, (B) the high solubility component is higher in solubility to the removing liquid than (A) the low solubility component. A mode that (B') the crack promoting component contains ketone as a carbonyl group includes a cyclic hydrocarbon. Specific examples thereof include 1,2-cyclohexane dione and 1,3-cyclohexane dione.

As a more specific mode, (B) the high solubility component is represented at least by any one of the following (B-1), (B-2), and (B-3).

(B-1) contains 1 to 6 of constituent units expressed by Chemical Formula 8 given below (preferably 1 to 4), and each of the constituent units is a compound bonded by a linking group (linker $L_1$). Here, the linker $L_1$ may be a single bond or may be $C_{1-6}$ alkylene. The $C_{1-6}$ alkylene links a constituent unit as a linker and is not limited to a divalent group. Divalent to tetravalent are preferable. The $C_{1-6}$ alkylene may be either a linear chain or a branched chain.

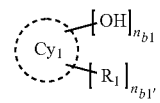

[Chemical Formula 8]

$Cy_1$ is a hydrocarbon ring of $C_{5-30}$, preferably phenyl, cyclohexane, or naphthyl, and more preferably phenyl. As a favorable mode, the linker $L_1$ links a plurality of $Cy_1$.

$R_1$ is each independently $C_{1-5}$ alkyl and preferably methyl, ethyl, propyl, or butyl. The $C_{1-5}$ alkyl may be either a linear chain or a branched chain.

$n_{b1}$ is 1, 2, or 3 and preferably 1 or 2 and, more preferably 1. $n_{b1'}$ is 0, 1, 2, 3, or 4 and preferably 0, 1, or 2.

Chemical Formula 9 given below is a chemical formula of the constituent unit of Chemical Formula 8 expressed by using linker $L_9$. The linker $L_9$ is preferably a single bond, methylene, ethylene or propylene.

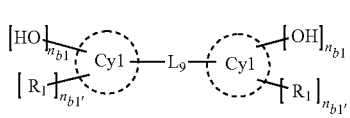

[Chemical Formula 9]

With no intention to limit the scope of claims, favorable examples of (B-1) include 2,2-bis(4-hydroxyphenyl)propane, 2,2'-methylenebis(4-methylphenol), 2,6-bis [(2-hydroxy-5-methylphenyl)methyl]-4-methylphenol, 1,3-cyclohexanediol, 4,4'-dihydroxy-biphenyl, 2,6-naphthalenediol, 2,5-di-tert-butylhydroquinone, and 1,1,2,2-tetrakis(4-hydroxyphenyl)ethane. These may be obtained by polymerization or condensation.

A description will be given with reference to 2,6-bis[(2-hydroxy-5-methylphenyl)methyl]-4-methylphenol shown in Chemical Formula 10 given below as an example. The compound has three constituent units of Chemical Formula 8 in (B-1) and the constituent units are linked by linker $L_1$ (methylene). $n_{b1}=n_{b1'}=1$, and $R_1$ is methyl.

[Chemical Formula 10]

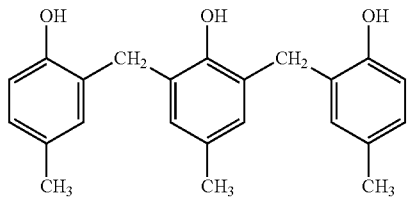

(B-2) is expressed by Chemical Formula 11 given below.

[Chemical Formula 11]

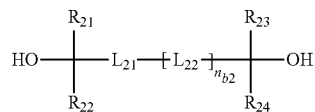

$R_{21}$, $R_{22}$, $R_{23}$, and $R_{24}$ are each independently hydrogen or $C_{1-5}$ alkyl, preferably hydrogen, methyl, ethyl, t-butyl or isopropyl, more preferably hydrogen, methyl, or ethyl, and further more preferably methyl or ethyl.

Linker $L_{21}$ and linker $L_{22}$ are each independently $C_{1-20}$ alkylene, $C_{1-20}$ cycloalkylene, $C_{2-4}$ alkenylene, $C_{2-4}$ alkynylene, or $C_{6-20}$ arylene. These groups may be substituted by $C_{1-5}$ alkyl or hydroxy. Here, alkenylene means a divalent hydrocarbon having one or more double bonds, and alkynylene means a divalent hydrocarbon group having one or more triple bonds. Linker $L_{21}$ and linker $L_{22}$ are preferably $C_{2-4}$ alkylene, acetylene ($C_2$ alkynylene), or phenylene, more preferably $C_{2-4}$ alkylene or acetylene, and further more preferably acetylene.

$n_{b2}$ is 0, 1 or 2, preferably 0 or 1 and more preferably 0.

With no intention to limit the scope of claims, favorable examples of (B-2) include 3,6-dimethyl-4-octyne-3, 6-diol, and 2,5-dimethyl-3-hexene-2,5-diol. Favorable examples of (B-2) in another form include 3-hexene-2,5-diol, 1,4-butynediol, 2,4-hexadiene-1,6-diol, 1,4-butanediol, cis-1,4-dihydroxy-2-butene, and 1,4-benzenedimethanol.

(B-3) contains the constituent unit expressed by Chemical Formula 12 given below and is a polymer having a weight average molecular weight (Mw) of 500 to 10,000. Mw is preferably 600 to 5,000 and more preferably 700 to 3,000.

[Chemical Formula 12]

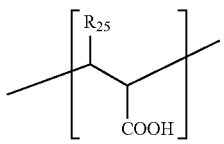

Here, $R_{25}$ is —H, —$CH_3$, or —COOH and preferably —H, or —COOH. It is permitted that one (B-3) polymer may contain two or more constituent units, each of which is expressed by Chemical Formula 12.

With no intention to limit the scope of claims, favorable examples of (B-3) polymer include acrylic acid, maleic acid and a polymer of their combination. More favorable examples are polyacrylic acid and a maleic acid/acrylic acid copolymer.

In the case of copolymerization, random copolymerization or block copolymerization is preferable, and random copolymerization is more preferable.

A description will be given, as an example, with reference to a maleic acid/acrylic acid copolymer shown in Chemical Formula 13 given below. The copolymer is contained in (B-3) and has two constituent units expressed by Chemical Formula 12. In one constituent unit, $R_{23}$ is —H and in another constituent unit, $R_{25}$ is —COOH.

[Chemical Formula 13]

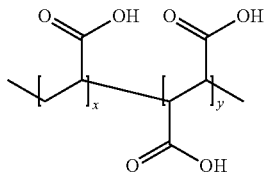

As a matter of course, the protective film forming liquid may contain a combination of one or two or more of the favorable examples as (B) the high solubility component. For example, (B) the high solubility component may contain both of 2,2-bis(4-hydroxyphenyl)propane and 3,6-dimethyl-4-octyne-3,6-diol.

A molecular weight of (B) the high solubility component may be 80 to 10,000. The molecular weight of the high solubility component is preferably 90 to 5000 and more preferably 100 to 3000. Where (B) the high solubility component is a resin, a polymeride, or a polymer, the molecular weight is expressed by a weight average molecular weight (Mw).

(B) The high solubility component can be obtained by synthesis or purchase. Suppliers include Sigma-Aldrich Japan, Tokyo Chemical Industry Co., Ltd., and Nippon Shokubai Co., Ltd.

In the protective film forming liquid, as compared with a mass of (A) the low solubility component, (B) the high solubility component is preferably 1 to 100 mass % and more preferably 1 to 50 mass %. In the protective film forming liquid, as compared with the mass of (A) the low solubility component, (B) the high solubility component is further more preferably 1 to 30 mass %.

<Solvent>

(C) The solvent preferably contains an organic solvent. (C) The solvent may have volatility. To have volatility means that it is higher in volatility than water. For example, (C) a boiling point of the solvent at one atmospheric pressure is preferably 50 to 250° C. The boiling point of the solvent at one atmospheric pressure is more preferably 50 to 200° C. and further more preferably 60 to 170° C. The boiling point of the solvent at one atmospheric pressure is still further more preferably 70 to 150° C. It is permissible that (C) the solvent may contain a small amount of pure water. The pure water contained in (C) the solvent is preferably not more than 30 mass %, as compared with an entirety of (C) the solvent. The pure water contained in the solvent is more preferably not more than 20 mass % and furthermore preferably not more than 10 mass %. The pure water contained in the solvent is still further more preferably not more than 5 mass %. Another favorable form is that the solvent is free of pure water (0 mass %). The pure water is preferably DIW.

The organic solvent includes alcohols such as isopropanol (IPA); ethylene glycol mono alkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol mono alkyl ethers such as propylene glycol monomethyl ether (PGME), propylene glycol monoethyl ether (PGEE); propylene glycol mono alkyl ether acetates such as propylene glycol monomethyl ether acetate (PGMEA), propylene glycol monoethyl ether acetate; esters of lactic acid such as methyl lactate, ethyl lactate (EL); aromatic hydrocarbons such as toluene, xylene; ketones such as methyl ethyl ketone, 2-heptane, cyclohexane; amides such as N,N-dimethylacetamide, N-methylpyrrolidone; and lactones such as γ-butyrolactone. These organic solvents may be used solely or in a mixture of two or more of them.

As a preferable mode, the organic solvent contained in (C) the solvent is selected from IPA, PGME, PGEE, EL, PGMEA or any combination of them. Where the organic solvent is a combination of two or more of them, a volume ratio thereof is preferably 20:80 to 80:20 and more preferably 30:70 to 70:30.

As compared with a total mass of the protective film forming liquid, (C) the solvent is 0.1 to 99.9 mass %. As compared with the total mass of the protective film forming liquid, (C) the solvent is preferably 50 to 99.9 mass % and more preferably 75 to 99.5 mass %. As compared with the total mass of the protective film forming liquid, (C) the solvent is furthermore preferably 80 to 99 mass % and still further more preferably 85 to 99 mass %.

<Corrosion Inhibiting Component>

(D) The corrosion inhibiting component includes uric acid, caffeine, pterin, adenine, glyoxylic acid, glucose, fructose, mannose, etc., in addition to BTA.

<Other Additives>

The protective film forming liquid of the present invention may also contain (E) other additives. As one mode of the present invention, (E) the other additives contain a surfactant, an acid, a base, an anti-bacterial agent, a sterilizer, an antiseptic agent, and a fungicide (preferably a surfactant) or may contain a combination of them.

As one mode of the present invention, as compared with a mass of (A) the low solubility component in the protective film forming liquid, (D) the other additives (the sum thereof in the case of a plurality of them) is 0 to 100 mass % (preferably 0 to 10 mass %, more preferably 0 to 5 mass %, further more preferably 0 to 3 mass %, and still further more preferably 0 to 1 mass %). Another mode of the present invention is that the protective film forming liquid is free of (E) other additives (0 mass %).

OTHER PREFERRED EMBODIMENTS

The present invention is not limited to the aforementioned preferred embodiments and can be executed in still other embodiments.

For example, in FIG. 1A and FIG. 13A, there is shown an example in which the controller (control device) 3 is disposed inside the substrate processing apparatus 2, 2Q. However, the controller 3 may be disposed independently from the substrate processing apparatus 2, 2Q.

Further, in the film coating/removing device 4A according to the aforementioned preferred embodiment, the protective film forming liquid and the removing liquid are discharged from the moving nozzle 9, and the rinse liquid is discharged from the fixed nozzle 10. However, these liquids are not necessarily required to be discharged from the nozzles provided in the aforementioned preferred embodiment, and no limitation is given to a form of the nozzle which discharges each of the liquids. For example, like the residue removing liquid, there may be provided such a configuration that these liquids are discharged through a discharge port from the central nozzle 11.

Further, in the aforementioned first preferred embodiment and the second preferred embodiment, the protective film 200 is coated and removed by the film coating/removing device 4A. However, removal of the protective film 200 by the removing liquid, rinsing of the protected target surface W1 of the substrate W, and residue removal from the protected target surface W1 may be executed by another liquid processing device 4 which is different from that in charge of coating of the protective film 200. In detail, the above may be executed by a film removing device which is not capable of coating the protective film 200 but capable of supplying the removing liquid, the rinse liquid, and the residue removing liquid to the substrate W. This film removing device is provided with a spin chuck similar in configuration to the first spin chuck 6A or the second spin chuck 6B. This spin chuck (third substrate holding unit) has a third base which faces the substrate W from below, thereby holding the substrate W horizontally.

Further, in one example of the substrate processing according to the aforementioned third preferred embodiment, the first turning step is executed by the turning unit 5A and the second turning step is executed by the turning unit 5B. However, the first turning step and the second turning step may be executed by either of the turning units.

Further, in the aforementioned first preferred embodiment and the second preferred embodiment, the first turning step and the second turning step are executed by the single turning unit 5. However, the plural number of the turning units 5 may be provided, and the first turning step and the second turning step may be executed by the turning units 5 which are different from each other.

Further, in each of the aforementioned preferred embodiments, the physical cleaning such as spray cleaning or scrub cleaning is executed on the cleaning target surface W2. However, the cleaning target surface W2 is not necessarily required to be cleaned by the physical cleaning and may be cleaned by supply of a cleaning liquid in a continuous flow.

The protective film forming liquid is not limited to those described above. For example, a resist film forming liquid and a reflection preventing film forming liquid may be used as the protective film forming liquid. In this case, a developer can be used as the removing liquid.

The reflection preventing film forming liquid contains a solvent and a solute. The solute contained in the reflection preventing film forming liquid includes an anthracene skeleton-containing reflection preventing film-type polymer having a hydrophilic group, for example. The anthracene skeleton-containing polymer is a copolymer of at least one type of monomer selected from a group which includes acrylic acid, methacrylic acid, vinyl alcohol, vinyl pyrrolidone, acrylic acid ester, and methacrylic acid ester and an anthracene skeleton-containing monomer. The solvent contained in the reflection preventing film forming liquid is, for example, an organic solvent or water. The solute contained in the reflection preventing film forming liquid may be a fluorine-based resin.

With regard to the organic solvent used as the present solvent, any one of the following may be selected depending on its purpose, that is, (a) hydrocarbons, for example, n-hexane, n-octane, cyclohexane, (b) alcohols, for example, methyl alcohol, ethyl alcohol, isopropyl alcohol, (c) ketones, for example, acetone, methyl ethyl ketone, (d) esters, for example, methyl acetate, ethyl acetate, ethyl lactate, (e) ethers, for example, diethyl ether, dibutyl ether, (f) other polar solvents, for example, dimethyl formamide, dimethyl sulfoxide, methyl cellosolve, cellosolve, butyl cellosolve, cellosolve acetate, alkyl cellosolve acetate, butyl carbitol, and carbitol acetate.

The resist film forming liquid contains a solvent and a resist composition as a solute which is dissolved in the solvent. As the resist composition which constitutes the resist film, a positive type resist composition and a negative type composition, etc., can be used. The positive type resist composition includes, for example, a composition composed of a quinonediazide-based photosensitizing agent and an alkali-soluble resin, a chemically-amplified resist composition, etc.

The negative type resist composition includes, for example, a composition that contains a highly polymerized compound having a photosensitizing group such as polycinnamic acid vinyl, a composition that contains an aromatic azide compound, or that containing an azide compound composed of cyclized rubber and a bisazide compound, a composition that contains a diazo resin, a photo-polymerization composition that contains an addition polymerization unsaturated compound, a chemically-amplified negative type resist composition, etc.

Here, examples of a quinonediazide-based photosensitizing agent used in the positive type resist composition composed of the quinonediazide-based photosensitizing agent and the alkali-soluble resin include 1,2-benzoquinone diazide-4-sulfonic acid, 1,2-naphthoquinone diazide-4-sulfonic acid, 1,2-naphthoquinone diazide-5-sulfonic acid, and esters or amides of these sulfonic acids. Further, examples of the alkali-soluble resin include a novolak resin, polyvinyl phenol, polyvinyl alcohol, a copolymer of acrylic acid and methacrylic acid, etc.

Preferable novolak resins include those produced from one or two types of phenols such as phenol, o-cresol, m-cresol, p-cresol, xylenol and from one or more types of aldehydes such as formaldehyde, paraformaldehyde, etc.

Further, the chemically-amplified resist composition may include either a positive type or a negative type. The chemically-amplified resist is a resist that produces an acid by irradiation to change the solubility of an irradiated portion to a developer by a chemical change due to catalysis of the acid, thereby forming a pattern and includes, for example, a resist that is composed of an acid producing compound which produces an acid by irradiation and an acid-sensitive group-containing resin which is decomposed in the presence of an acid and produces an alkali-soluble group such as a phenol hydroxyl group or a carboxyl group, and a resist that is composed of an alkali-soluble resin, a cross-linking agent, and an acid producing agent.

Further, a water-soluble polymer containing liquid in which a solvent is evaporated to form a water-soluble film can be used as the protective film forming liquid.

The water-soluble polymer contains, for example, at least any one of cellulose-based polymers such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxyethyl cellulose, cellulose acetate hexahydrophthalate, carboxymethyl cellulose, ethyl cellulose, methyl cellulose; acryl-based polymers such as N,N-dimethyl acryl amide, dimethyl aminopropylmethacrylamide, N,N-dimethyl aminopropyl acrylamide, N-methyl acrylamide, diacetone acrylamide, dimethyl aminoethyl methacrylate, diethyl aminoethyl methacrylate, N,N-dimethyl aminoethyl acrylate, acryloylmorpholine, acrylic acid; and vinyl-based polymers such as polyvinyl alcohol, polyvinyl pyrrolidone. These water-soluble polymers may be used solely or may be used in combination of two or more of them.

Where a water-soluble film is used as the protective film, DIW is used as the removing liquid, by which the protective film is dissolved in the removing liquid and removed from the substrate W (dissolving/removing step). In this case, supply of the rinse liquid can be omitted. As with the first preferred embodiment and the second preferred embodiment, even where the protective film is configured of the low solubility solids and the high solubility solids, supply of the rinse liquid can be omitted in using DIW as the removing liquid.

In this specification, where a range of values is indicated by using symbols such as "~" and "-," unless otherwise specified, these include end points on both sides and a unit is commonly used. For example, 5-25 mole % means not less than 5 mole % and not more than 25 mole %.

In the aforementioned preferred embodiments, expressions such as "along," "horizontal," and "vertical" are used. However, these expressions are not required to be "along," "horizontal," and "vertical" in a strict sense. That is, each of the expressions may permit a deviation from the accuracy required on production or installation.

While the preferred embodiments of the present invention have been described in detail, these are merely specific examples used to clarify the technical content of the present invention, and the present invention should not be interpreted as being limited to these specific examples and the scope of the present invention shall be limited only by the appended claims.

What is claimed is:

1. A substrate processing system comprising:
 a first substrate holding unit which includes a first base that faces from below a substrate having a protected target surface and a cleaning target surface on the opposite side of the protected target surface and holds the substrate in a first posture in which the protected target surface is facing upward;
 a protective film coating nozzle which coats a protective film at least at a peripheral edge portion of the protected target surface of the substrate that is held by the first substrate holding unit;
 a first turning unit which turns around the substrate while in contact with a peripheral edge portion of the substrate so that the posture of the substrate can be changed from the first posture to a second posture in which the protected target surface is facing downward;
 a second substrate holding unit which includes a second base that faces the substrate from below and holds the substrate in the second posture; and
 a cleaning unit which cleans the cleaning target surface of the substrate that is held by the second substrate holding unit, wherein the protective film coating nozzle is configured so as to coat the protective film on the entirety of the protected target surface of the substrate, and the second substrate holding unit includes a second suctioning/holding unit in which a central portion of the protected target surface is suctioned by the second base to hold the substrate.

2. The substrate processing system according to claim 1, wherein
the first substrate holding unit includes a first suctioning/holding unit in which a central portion of the cleaning target surface is suctioned by the first base to hold the substrate.

3. The substrate processing system according to claim 1, wherein
the second substrate holding unit includes a plurality of chuck pins which are supported by the second base and are brought into contact with the peripheral edge portion of the protected target surface of the substrate.

4. The substrate processing system according to claim 1, wherein
the cleaning unit includes a spray nozzle which sprays droplets of a cleaning liquid toward the cleaning target surface, thereby executing spray cleaning on the cleaning target surface.

5. The substrate processing system according to claim 1, wherein
the cleaning unit includes a cleaning member which is brought into contact with the cleaning target surface of the substrate to scrub-clean the cleaning target surface.

6. The substrate processing system according to claim 1, further comprising:
a second turning unit which turns around the substrate while in contact with a peripheral edge portion of the substrate so that the posture of the substrate can be changed from the second posture to the first posture;
a third substrate holding unit which includes a third base that faces the substrate from below and holds the substrate in the first posture; and
a removing liquid nozzle which supplies a removing liquid that removes the protective film from the protected target surface to the protected target surface of the substrate that is held by the third substrate holding unit.

7. The substrate processing system according to claim 6, wherein
the first substrate holding unit also serves as the third substrate holding unit.

8. The substrate processing system according to claim 1, further comprising:
a second turning unit which turns around the substrate while in contact with a peripheral edge portion of the substrate so that the posture of the substrate can be changed from the second posture to the first posture;
a third substrate holding unit which includes a third base that faces the substrate from below and holds the substrate in the first posture; and
a drying/removing unit which executes plasma processing or light irradiation processing on the protected target surface of the substrate that is held by the third substrate holding unit, thereby removing the protective film from the protected target surface.

9. The substrate processing system according to claim 1, further comprising a gas supplying unit which supplies a gas to a space between the protected target surface of the substrate that is held by the second substrate holding unit and the second base.

10. The substrate processing system according to claim 1, further comprising:
a container placing member which places a container that houses the substrate in the first posture; and
a transfer unit which has a hand in contact with a peripheral edge portion of the cleaning target surface or the protected target surface of the substrate that is facing downward and transfers the substrate between the container placing member, the first substrate holding unit, the first turning unit, and the second substrate holding unit.

* * * * *